(12) United States Patent
Higashino

(10) Patent No.: US 7,825,739 B2
(45) Date of Patent: Nov. 2, 2010

(54) SIGNAL PROCESSING CIRCUIT, SIGNAL PROCESSING METHOD, AND PLAYBACK APPARATUS

(75) Inventor: Satoru Higashino, Tokyo (JP)

(73) Assignee: Sony Corporation, Tokyo (JP)

( * ) Notice: Subject to any disclaimer, the term of this patent is extended or adjusted under 35 U.S.C. 154(b) by 130 days.

(21) Appl. No.: 12/329,810

(22) Filed: Dec. 8, 2008

(65) Prior Publication Data

US 2009/0179707 A1 Jul. 16, 2009

(30) Foreign Application Priority Data

Jan. 16, 2008 (JP) .............................. 2008-007251

(51) Int. Cl.
*H03L 7/085* (2006.01)
(52) U.S. Cl. ..................... 331/17; 331/1 A; 327/159; 375/376
(58) Field of Classification Search ................... 331/17, 331/1 A; 327/159; 375/376
See application file for complete search history.

(56) References Cited

U.S. PATENT DOCUMENTS

| 5,450,452 | A | * | 9/1995 | Kakuishi et al. | ............. 375/376 |
| 5,619,543 | A | * | 4/1997 | Glass | ........... 375/376 |
| 5,629,649 | A | * | 5/1997 | Ujiie | ............................ 331/17 |
| 5,805,024 | A | | 9/1998 | Takashi et al. | |
| 6,236,343 | B1 | | 5/2001 | Patapoutian | |
| 6,847,598 | B2 | * | 1/2005 | Ikai | ......................... 369/44.34 |
| 6,967,606 | B2 | * | 11/2005 | Wiesbauer et al. | .......... 341/143 |
| 2007/0092040 | A1 | | 4/2007 | Higashino | |

FOREIGN PATENT DOCUMENTS

| JP | 8-107352 | 4/1996 |
| JP | 2007-122774 | 5/2007 |

* cited by examiner

*Primary Examiner*—Joseph Chang
(74) *Attorney, Agent, or Firm*—Oblon, Spivak, McClelland, Maier & Neustadt, L.L.P.

(57) ABSTRACT

A signal processing circuit includes a feedback control loop that includes a loop filter and that detects the difference between a target value and a control value to control the difference so that the difference has a predetermined value. A closed loop formed in the feedback control loop is expressed by the delay of the entire closed loop serving as the feedback control loop, the loop filter, and simple integration of a final stage. The signal processing circuit includes a moving average calculating unit configured to calculate a moving average of outputs from the loop filter; a multiplying unit configured to multiply a value calculated in the loop filter by a certain gain; and an integrating unit provided upstream of the loop filter so that calculation results by the moving average calculating unit and the multiplication unit are concurrently fed back to an input into the loop filter.

9 Claims, 15 Drawing Sheets

SIGNAL PROCESSING CIRCUIT, SIGNAL PROCESSING METHOD, AND PLAYBACK APPARATUS

CROSS REFERENCES TO RELATED APPLICATIONS

The present invention contains subject matter related to Japanese Patent Application JP 2008-007251 filed in the Japanese Patent Office on Jan. 16, 2008, the entire contents of which are incorporated herein by reference.

BACKGROUND OF THE INVENTION

1. Field of the Invention

The present invention relates to signal processing circuits forming feedback control loops including filters and, more particularly, to a signal processing circuit and a signal processing method that compensate loop delays. The present invention also relates to a playback apparatus in which the signal processing circuit is applied to a phase locked loop (PLL) circuit that controls the phase and frequency of a signal read out from a recording medium.

2. Description of the Related Art

Some systems of playing back data recorded on optical disk recording media, such as compact discs (CDs), digital versatile disks (DVDs), or Blu-Ray discs (BDs) (registered trademark) discs, or magnetic recording media, such as hard disk drives (HDDs), and some data communication systems perform digital sampling of readout signals and reception signals. In the sampling of such readout signals and receptions signals, PLL circuits are used so that the sampling values at appropriate sampling times are measured. In other words, the PLL circuits are used to appropriately control the sampling times of input signals or to perform waveform interpolation to the input signals (an interpolated timing recovery (ITR) method described below) in order to measure the sampling values at the appropriate sampling times.

An increase in the processing speeds of the PLL circuits used in the digital sampling is demanded in order to respond to an increase in the recording densities of recording media and an increase in the data communication speed in recent years. In such a situation, pipeline processing is generally applied to the PLL circuits.

However, with the pipeline processing, the presence of a pipeline delay causes the corresponding loop delay to occur in a feedback control loop. In other words, the loop delay degrades the pull-in performance of the PLL. The loop delay can cause the feedback control loop to lose the phase margin and, specifically, can cause a decrease in the pull-in speed (a delay in the convergence time). In addition, a capture range is decreased as the loop delay is increased. The capture range means a range over which the PLL can pull in any frequency difference.

Various technologies in related art are proposed in, for example, Japanese Unexamined Patent Application Publication No. 8-107352, Japanese Unexamined Patent Application Publication No. 2007-122774, and U.S. Pat. No. 6,236,343 in the above situations.

Of the above documents, Japanese Unexamined Patent Application Publication No. 8-107352 concerns a technology for increasing the speed of phase locking.

Japanese Unexamined Patent Application Publication No. 2007-122774 according to the assignee of the present application proposes a technology for pulling in a frequency difference and, then, pulling in a phase difference to expand the capture range.

The technologies disclosed in Japanese Unexamined Patent Application Publication No. 8-107352 and Japanese Unexamined Patent Application Publication No. 2007-122774 can be used to take certain measures against the decrease in the pull-in speed involved in the loop delay or the decrease in the capture range. However, it is not possible to fundamentally resolve the problems concerning the loop delay.

Specifically, with the technology disclosed in Japanese Unexamined Patent Application Publication No. 8-107352, if the frequency difference is present in a playback waveform, it is not possible to fully pull in the phase even at a higher pull-in speed because of the presence of the frequency difference and, if a longer loop delay occurs, the device can possibly be damaged. In other words, the phase locking can be performed at a high speed whereas the capture range is sacrificed.

With the technology disclosed in Japanese Unexamined Patent Application Publication No. 2007-122774, since the phase difference is converged after the frequency difference is converged, the final convergence time is given by adding the convergence time of the phase difference and that of the frequency difference. Accordingly, there is a problem in that the convergence time becomes longer than the time when both the frequency difference and the phase difference are concurrently pulled in. In other words, the capture range can be expanded whereas the convergence time is sacrificed.

In order to overcome the delay in the convergence time and the decrease in the capture range which are caused by the loop delay, it is effective to compensate the loop delay itself. Accordingly, technologies for using a Kalman filter to compensate the loop delay of the PLL are proposed in U.S. Pat. No. 6,236,343, "Application of Kalman Filters With a Loop Delay in Synchronization" Ara Patapoutian, IEEE Transactions on Communications, Vol. 50, No. 5, May 2002 (hereinafter referred to as Reference Document 1), and "Timing Recovery Loop Delay Compensation by Optimal Loop Gains" Jin Xie and B. V. K. Vijaya Kumar, Data Storage Center (DSSC), Electrical and Computer Engineering Department, Carnegie Mellon University, IEEE ICC 2006 Proceedings (hereinafter referred to as Reference Document 2).

SUMMARY OF THE INVENTION

However, with the methods disclosed in U.S. Pat. No. 6,236,343 and Reference Documents 1 and 2, it is necessary to feed back the output from a voltage controlled oscillator (VCO) or a number controlled oscillator (NCO) to the input into the loop filter in the compensation of the loop delay. The output from the VCO or the NCO is represented by an integration phase as long as the output is handled in a physical model as in the above documents. Accordingly, when the configuration in which the output from the VCO or the NCO is fed back to the input into the loop filter is actually implemented as a circuit, it is necessary for the output from the VCO or the NCO to be converted into information that is not the integration phase. Specifically, with the configuration using the VCO, it is necessary to provide a frequency-phase information converter that physically measures the edge position of the signal output from THE VCO, which is a frequency control signal, and converts the measured edge position into information about the amount of phase. When the NCO is used to realize the ITR method, oversampling is performed by an analog-to-digital converter at a speed slightly higher than the data rate. Accordingly, when the output from the NCO is fed back to the input into the loop filter, it is necessary to provide a phase information converter that performs division of an oversampling rate for the output from the NCO to be fed back to the loop filter to return the output from the VCO into normal phase information without the oversampling.

It is very difficult to realize the frequency-phase information converter, which physically measures the edge position of the output from the VCO and converts the measured edge position into phase information, as an actual configuration. It is also very difficult to actually configure the phase information converter when the NCO is used.

Accordingly, it is very difficult to actually realize the methods for the compensation of the loop delay in the related art, disclosed in U.S. Pat. No. 6,236,343 and Reference Documents 1 and 2.

In order to resolve the above problems, it is desirable to actually realize a configuration capable of compensating the loop delay occurring in the feedback control loop to improve the convergence performance.

According to an embodiment of the present invention, a signal processing circuit is configured so as to compose a feedback control loop that includes a loop filter and that detects the difference between a target value and a control value to control the difference so that the difference has a predetermined value. A closed loop formed in the feedback control loop is expressed by the delay of the entire closed loop serving as the feedback control loop, the loop filter, and simple integration of a final stage. The signal processing circuit includes moving average calculating means for calculating a moving average of outputs from the loop filter; multiplying means for multiplying a value calculated in the loop filter by a certain gain; and integrating means provided upstream of the loop filter so that a calculation result by the moving average calculating means and a calculation result by the multiplication means are concurrently fed back to an input into the loop filter.

According to another embodiment of the present invention, a signal processing method is provided. When a closed loop formed in a feedback control loop that includes a loop filter and that detects the difference between a target value and a control value to control the difference so that the difference has a predetermined value is expressed by the delay of the entire closed loop serving as the feedback control loop, the loop filter, and simple integration of a final stage, a moving average of outputs from the loop filter and a value resulting from multiplication of a value calculated in the loop filter by a certain gain are concurrently fed back to an input into the loop filter.

According to another embodiment of the present invention, a playback apparatus at least plays back data recorded on a recording medium. The playback apparatus includes readout means for reading out a signal recorded on the recording medium and a phase locked loop circuit configured so as to serve as a control system for a secondary delay unit that includes a loop filter including a proportion filter and an integration filter. The phase locked loop circuit controls the phase and frequency of the signal read out by the readout means. The phase locked loop circuit is configured so that a closed loop formed in a feedback control loop is expressed by the delay of the entire closed loop serving as the feedback control loop, the loop filter, and simple integration of a final stage. The phase locked loop circuit includes moving average calculating means for calculating a moving average of outputs from the loop filter; multiplying means for multiplying an integration term of the loop filter by a certain gain; and integrating means provided upstream of the loop filter so that a calculation result by the moving average calculating means and a calculation result by the multiplication means are concurrently fed back to an input into the loop filter.

As described above, according to the embodiments of the present invention, the moving average of the outputs from the loop filter and the value resulting from multiplication of a value calculated in the loop filter by a certain gain are fed back to the input into the loop filter. Such a configuration allows a loop delay occurring in the feedback control loop to be compensated, as described below. In the compensation of the loop delay, it is sufficient to feed back the components only based on values calculated in the loop filter to the input into the loop filter. Accordingly, according to the embodiments of the present invention, it is not necessary to feed back the output from a VCO or NCO to the loop filter, unlike the related art, in the compensation of the loop delay.

According to the present invention, it is not necessary to feed back the output from the VCO or NCO to the loop filter, unlike the related art, in the compensation of the loop delay. The compensation of the loop delay can be performed only on the basis of the values calculated in the loop filter. As a result, it is not necessary to provide components, such as the frequency-phase information converter or the phase information converter, which are difficult to be realized. Accordingly, it is possible to realize the configuration capable of compensating the loop delay.

DESCRIPTION OF THE PREFERRED EMBODIMENTS

Embodiments of the present invention will herein be described with reference to the attached drawings.

Configuration of Playback Apparatus

Figure 1:
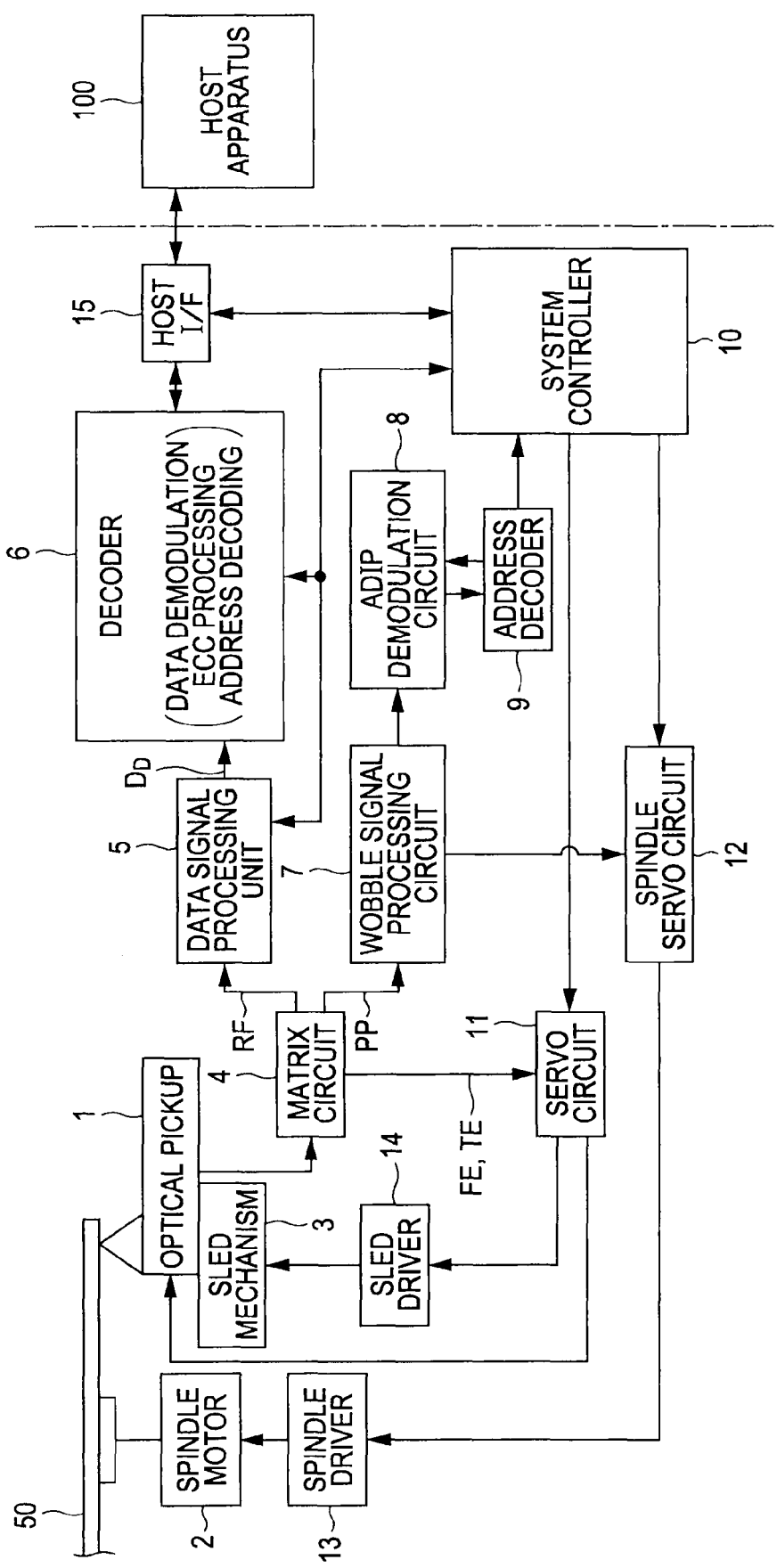
FIG. 1 is a block diagram showing an example of the internal configuration of a playback apparatus including a signal processing circuit according to an embodiment of the present invention.

FIG. 1 is a block diagram showing an example of the internal configuration of a disk drive apparatus embodying a playback apparatus according to an embodiment of the present invention.

Referring to FIG. 1, the disk drive apparatus is capable of playing back data recorded on an optical disk 50, which is a Blu-ray disc (BD) (registered trademark). It is assumed that the disk drive apparatus is a playback-only apparatus capable of only playback of data. The optical disk 50 may be a playback-only read only memory (ROM) disk on which data is recorded by using pits and lands or may be a recordable disk, such as a write-once optical disk or a rewritable optical disk. Specifically, the optical disk 50 may be a BD-recordable (BD-R) or a BD-rewritable (BD-RE).

When the optical disk 50 is loaded on the disk drive apparatus in FIG. 1, the optical disk 50 is mounted on a turntable (not shown) and is rotated and driven by a spindle motor 2 at a constant linear velocity (CLV).

In the playback, a signal recorded on the track on the optical disk 50 by using a pit or mark is read out by an optical pickup (optical head) 1.

Management information only for the playback recorded on the optical disk 50 is also read out by the optical pickup 1. The management information is, for example, physical information about the disk and is recorded on the optical disk 50 by using embossed pits or wobbling grooves. In addition, Address In Pregroove (ADIP) information recorded on the recordable optical disk 50 is also read out by the optical pickup 1. The ADIP information is embedded in the recordable optical disk 50 as the wobbling of the groove track.

The optical pickup 1 includes a laser diode serving as a laser light source, a photodetector that detects a reflected light, an objective lens from which a laser light is output, and an optical unit that irradiates the recording surface of the disk with the laser light through the objective lens and leads the reflected light to the photodetector (the laser diode, the photodetector, the objective lens, and the optical units are not shown in FIG. 1). The laser diode is capable of outputting a laser light of a wavelength $\lambda$ (=405 nm).

In the optical pickup 1, the objective lens is held by a two-axis mechanism such that the objective lens is capable of moving in the tracking direction and the focusing direction.

The optical pickup 1 also includes a spherical aberration correction mechanism so as to support the optical disk 50, which is a BD.

The entire optical pickup 1 is capable of moving in the radius direction of the disk by a sled mechanism 3, as shown in FIG. 1.

Information on the reflected light from the optical disk 50 is detected by the photodetector, is converted into an electrical signal corresponding to the amount of received light, and is supplied to a matrix circuit 4.

The matrix circuit 4 includes a current-voltage conversion circuit, a matrix operation-amplifying circuit, etc. for currents output from multiple light receiving elements serving as the photodetector and generates necessary signals by the matrix operation. Specifically, the matrix circuit 4 generates a radio-frequency (RF) signal (playback data signal RF) corresponding to a signal (playback signal) read out from the optical disk 50, a focus error signal FE used for servo control, a tracking error signal TE, and so on.

The matrix circuit 4 also generates a push-pull signal PP as a signal concerning the wobbling of the groove, that is, as a signal used for detecting the wobbling.

The RF signal output from the matrix circuit 4 is supplied to a data signal processing unit 5, the focus error signal FE and the tracking error signal TE output therefrom are supplied to a servo circuit 11, and the push-pull signal PP output therefrom is supplied to a wobble signal processing circuit 7.

The data signal processing unit 5 performs PLL processing to the RF signal and binarization processing by a partial response maximum likelihood (PRML) decoding method. In order to realize the PRML decoding process, the RF signal is subjected to digital sampling. The PLL processing is performed so that the sampling value at an appropriate sampling time is measured.

In the data signal processing unit 5, a binary data sequence $D_D$ is generated by the binarization processing. The binary data sequence $D_D$ is supplied to a decoder 6.

The internal configuration of the data signal processing unit 5 will be described in detail below.

The decoder 6 demodulates the binary data sequence $D_D$ generated by the data signal processing unit 5. Specifically, the decoder 6 performs data demodulation, deinterleaving, error correcting code (ECC) decoding, address decoding, and so on. The decoder 6 obtains playback data from the optical disk 50 through the above processing.

The playback data resulting from the decoding by the decoder 6 is transferred to a host interface 15 and is transmitted from the host interface 15 to a host apparatus 100 in response to an instruction from a system controller 10.

The host apparatus 100 is, for example, a computer apparatus or an audio-visual (AV) system.

When the optical disk 50 is a recordable disk, the ADIP information is processed in the playback of the data on the optical disk 50.

The push-pull signal PP output from the matrix circuit 4 as the signal concerning the wobbling of the groove is digitized into wobble data in the wobble signal processing circuit 7. A clock in synchronization with the push-pull signal PP is generated in the PLL processing.

The wobble data is subjected to minimum shift keying (MSK) demodulation and saw-tooth wobble (STW) demodulation in an ADIP demodulation circuit 8 to be demodulated into a data stream composing an ADIP address. The data stream is supplied to an address decoder 9.

The address decoder 9 decodes the supplied data to obtain an address value and supplies the address value to the system controller 10.

The servo circuit 11 generates various servo drive signals including a focus drive signal, a tracking drive signal, and a sled drive signal from the focus error signal FE and the tracking error signal TE supplied from the matrix circuit 4 to execute servo operations in response to the focus, tracking, and sled drive signals. Specifically, the servo circuit 11 generates the focus drive signal and the tracking drive signal in response to the focus error signal FE and the tracking error signal TE to drive a focus coil and a tracking coil in the two-axis mechanism in the optical pickup 1, respectively. As a result, the optical pickup 1, the matrix circuit 4, the servo circuit 11, and the two-axis mechanism compose a tracking servo loop and a focus servo loop.

The servo circuit 11 turns off the tracking servo loop in response to a track jump instruction from the system controller 10 and outputs a jump drive signal to execute a track jump operation.

In addition, the servo circuit 11 gives a focus bias to the focus servo loop in response to an instruction from the system controller 10.

The servo circuit 11 supplies a drive signal for the spherical aberration correction to the spherical aberration correction mechanism in the optical pickup 1 in response to an instruction from the system controller 10.

Furthermore, the servo circuit 11 generates the sled drive signal on the basis of a sled error signal generated as a low-frequency component of the tracking error signal TE and access execution control by the system controller 10 and causes a sled driver 14 to drive the sled mechanism 3. The sled mechanism 3 includes a main shaft supporting the optical pickup 1, a sled motor, and a transmission gear although not shown in FIG. 1. The sled mechanism 3 drives the sled motor in response to the sled drive signal to slide the optical pickup 1 by a predetermined amount.

A spindle servo circuit 12 causes the spindle motor 2 to rotate at the CLV.

Specifically, the spindle servo circuit 12 obtains the clock generated in the PLL processing for the wobble signal as information about the current rotation speed of the spindle motor 2 and compares the information about the current rotation speed of the spindle motor 2 with information about a predetermined CLV reference speed to generate a spindle error signal.

When the optical disk 50 is a playback-only ROM disk, for example, a playback clock generated on the basis of the PLL processing in the data signal processing unit 5 is used as the information about the current rotation speed of the spindle motor 2. In this case, the spindle servo circuit 12 compares the playback clock with the information about the predetermined CLV reference speed to generate the spindle error signal.

The spindle servo circuit 12 outputs a spindle drive signal generated on the basis of the spindle error signal to cause a spindle driver 13 to rotate the spindle motor 2 at the CLV.

In addition, the spindle servo circuit 12 generates the spindle drive signal in response to a spindle kick-brake signal supplied from the system controller 10 to activate the spindle motor 2, to stop the spindle motor 2, to increase the speed of the spindle motor 2, or to decrease the speed of the spindle motor 2 in response to the spindle drive signal.

The various operations of the servo unit and the recording-playback unit described above are controlled by the system controller 10 formed of a microcomputer.

The system controller 10 executes a variety of processing in response to commands transmitted from the host apparatus 100 through the host interface 15.

For example, if a "read" command to request transfer of certain data recorded on the optical disk 50 is supplied from the host apparatus 100, the system controller 10 targets control of a seek operation at a specified address. That is, the system controller 10 instructs the servo circuit 11 to perform an access operation to the optical pickup 1 at the address specified by the "read" command.

Then, the system controller 10 controls an operation necessary to transfer the data in the specified data segment to the host apparatus 100. Specifically, the system controller 10 causes the optical pickup 1 to read out a signal from the optical disk 50 and causes the data signal processing unit 5 and the decoder 6 to play back the readout signal to transmit the data that is requested to the host apparatus 100.

Although the playback apparatus is described as the disk drive apparatus connected to the host apparatus 100 in the example in FIG. 1, the playback apparatus according to the embodiment of the present invention may not be connected to another apparatus. In this case, the playback apparatus includes an operation unit and a display unit or includes an interface unit for inputting and outputting data, which has a configuration different from that in FIG. 1. The playback apparatus may have any configuration as long as the playback is performed in response to a user's operation and the playback apparatus includes a terminal unit used for inputting and outputting a variety of data.

The playback apparatus may have another configuration, for example, a recordable configuration. In other words, the playback apparatus according to the embodiment of the present invention may be a recording-playback apparatus.

Internal Configuration of Data Signal Processing Unit

The internal configuration of the data signal processing unit 5 shown in FIG. 1 will now be described.

As described above, the data signal processing unit 5 is configured so as to perform the digital sampling of the RF signal and to perform the binarization processing by the PRML decoding method on the basis of the sampled values. In the digital sampling of the RF signal, the PLL is used so that the sampling value at the appropriate sampling time is measured.

The PLL circuit in this case adopts either one of the following two general configurations.

Figure 2:
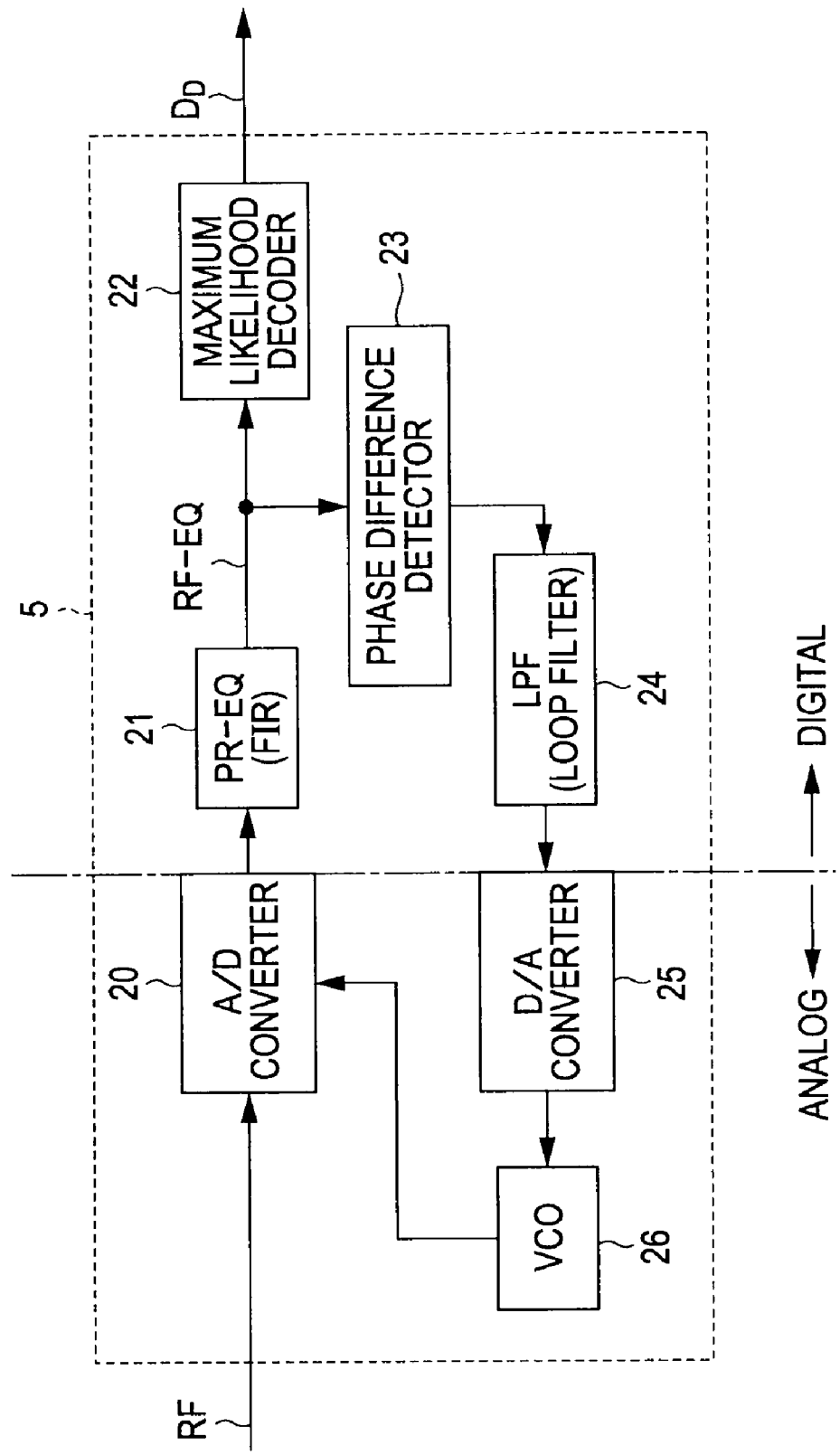
FIG. 2 is a block diagram showing an example of the internal configuration of a data signal processing unit including the signal processing circuit according to the embodiment of the present invention when a VCO is used.

One configuration uses a VCO as in the data signal processing unit 5 shown in FIG. 2. In this configuration, the sampling timing of an analog-to-digital (A/D) converter 20 that samples the RF signal is controlled on the basis of the output from the VCO.

Figure 3:
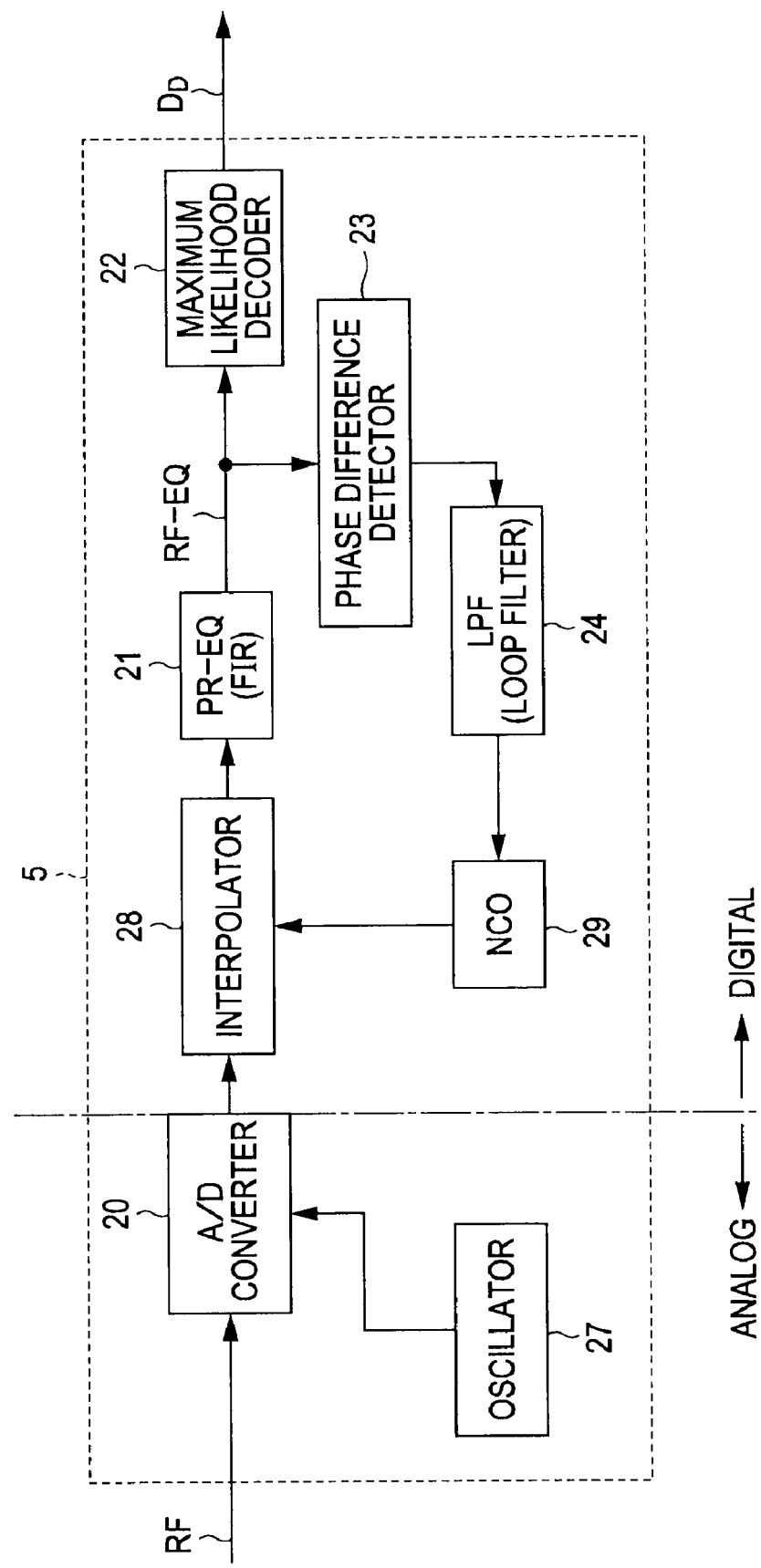
FIG. 3 is a block diagram showing an example of the internal configuration of the data signal processing unit including the signal processing circuit according to the embodiment of the present invention when an ITR method is adopted.

The other configuration uses an interpolator 28 to realize the so-called ITR method, as in the data signal processing unit 5 shown in FIG. 3. In this configuration, an interpolation process is performed to the RF signal in accordance with the result of detection of a phase difference to achieve timing synchronization.

First, an example of the configuration including the PLL circuit using the VCO will be described with reference to FIG. 2.

In the example of the configuration shown in FIG. 2, the RF signal supplied from the matrix circuit 4 in FIG. 1 is received by the A/D converter 20. The A/D converter 20 samples the RF signal at a sampling period based on a clock signal output from a VCO 26 described below.

The RF signal resulting from the digital sampling by the A/D converter 20 is supplied to a partial response equalizer (PR-EQ) 21.

The partial response (PR) equalizer 21 is, for example, a finite impulse response (FIR) filter that performs PR equalization to the RF signal. The RF signal resulting from the PR equalization by the PR equalizer 21 is denoted by an RF-EQ signal.

The RF-EQ signal is supplied to a maximum likelihood decoder 22. The maximum likelihood decoder 22 performs maximum likelihood decoding to convert the RF-EQ signal into the binary data sequence $D_D$ and outputs the binary data sequence $D_D$.

The RF-EQ signal branches to be supplied to a phase difference detector 23.

The phase difference detector 23 calculates the phase difference between the current phase and a predetermined target phase (the appropriate sampling time) on the basis of the sampling value of the RF signal resulting from the PR equalization, which is the RF-EQ signal.

Information about the phase difference calculated by the phase difference detector 23 is supplied to a low-pass filter (LPF) 24.

The LPF 24 is a so-called loop filter. The LPF 24 extracts a low-frequency component of the phase difference supplied from the phase difference detector 23 to generate a frequency control signal used for correction to measure the appropriate sampling time.

The frequency control signal generated by the LPF 24 is supplied to a digital-to-analog (D/A) converter 25. The D/A converter 25 converts the frequency control signal into an analog signal and supplies the analog signal to the VCO 26.

The VCO 26 varies the frequency of the clock signal that is output from the VCO 26 itself on the basis of the frequency control signal that is supplied. The clock signal is supplied to the A/D converter 20 as information indicating the sampling time by its rising edge or falling edge.

The A/D converter 20, the PR equalizer 21, the phase difference detector 23, the LPF 24, the D/A converter 25, and the VCO 26 compose a feedback control loop serving as the PLL in the configuration shown in FIG. 2. However, as apparent from FIG. 2, the feedback control loop includes both the analog components and the digital components in the configuration using the VCO.

Next, an example of the configuration adopting the ITR method will be described with reference to FIG. 3.

The same reference numerals are used in FIG. 3 to identify the same components shown in FIG. 2. A description of such components is omitted herein.

The exemplary configuration in FIG. 3 differs from the exemplary configuration in FIG. 2 in that the A/D converter 20 samples the RF signal on the basis of a clock signal having a fixed frequency output from an oscillator 27, that the interpolator 28 is provided between the A/D converter 20 and the PR equalizer 21, and that an NCO 29 is provided to control the interpolation operation by the interpolator 28 on the basis of the frequency control signal generated by the LPF 24.

The ITR method is described in detail in Japanese Unexamined Patent Application Publication No. 2005-108295. In the ITR method, basically, the RF signal supplied in the above manner is sampled at a fixed sampling period and the interpolation process based on the frequency control signal generated by the LPF 24 is performed to the sampled RF signal to achieve the timing synchronization so that the sampling value at the appropriate sampling time is measured.

When the ITR method is adopted in the PLL in the playback unit for the recording medium as in the example shown in FIG. 3, the input waveform is oversampled at a frequency slightly higher than the data rate so that downsampling does not occur. Accordingly, for example, a frequency (oversampling frequency) 1.1 times higher than the data rate is set as the oscillation frequency of the oscillator 27.

Although the NCO 29 basically has a function similar to that of the VCO 26 described above, the NCO 29 differs from the VCO 26 in that the output from the NCO 29 is not frequency information but phase information. Information indicating the amount of phase within the clock period is used as the phase information so as to support the oversampling in the A/D converter 20.

The interpolator 28 performs the interpolation to the RF signal supplied from the A/D converter 20 on the basis of the phase information calculated by the NCO 29. This interpolation allows the sampling value at the appropriate sampling time to be measured, thus achieving the same effect as in the case where the VCO 26 is used.

The interpolator 28, the PR equalizer 21, the phase difference detector 23, the LPF 24, and the NCO 29 compose the feedback control loop in the configuration adopting the ITR method shown in FIG. 3. As apparent from FIG. 3, these components are all digital circuits and, therefore, the PLL can be formed of only the digital components when the ITR method is adopted.

The internal configuration of the LPF 24 shown in FIGS. 2 and 3 features in the PLL circuits according to the embodiment of the present invention. The internal configuration of the LPF 24 will be described in detail below.

Compensation of Loop Delay in Related Art

As described above, the PLL circuit that performs the timing synchronization to the signal read out from the recording medium generally adopts the pipeline processing in order to increase the processing speed, as in the present embodiment of the present invention. In the pipeline processing, the presence of a pipeline delay causes the corresponding loop delay to occur in the feedback control loop and the loop delay undesirably degrades the pull-in performance of the PLL. The loop delay can cause the feedback control loop to lose the phase margin. Specifically, the loop delay can cause a decrease in the pull-in speed (a delay in the convergence time) and a decrease in the capture range.

In order to resolve the above problems, the technologies for compensating the loop delay in the related art are proposed in, for example, U.S. Pat. No. 6,236,343 and Reference Documents 1 and 2. In these technologies, the loop delay causing the degrading of the performance is directly compensated to increase the processing speed and improve the convergence performance of the PLL by the introduction of the pipeline processing.

A specific configuration of such a technology in the related art for compensating the loop delay will now be sequentially described.

First, representation of the general feedback control loop as a dynamic model including a system unit and an observation unit will now be considered.

The system unit is expressed by Equation (1):

$$x_{k+1} = Fx_k + w_k \qquad (1)$$

The observation unit is expressed by Equation (2):

$$y_{k+1} = Hx_k + v_k \qquad (2)$$

In Equations (1) and (2), "$x_k$" denotes a state vector representing the state space in the system, "F" denotes a system matrix, "$y_k$" denotes an observation vector, "H" denotes an observation matrix, "$w_k$" denotes a disturbance or noise, and "$v_k$" denotes a term defined by a statistical distribution indicating a dynamic behavior during the feedback control.

Figure 4:
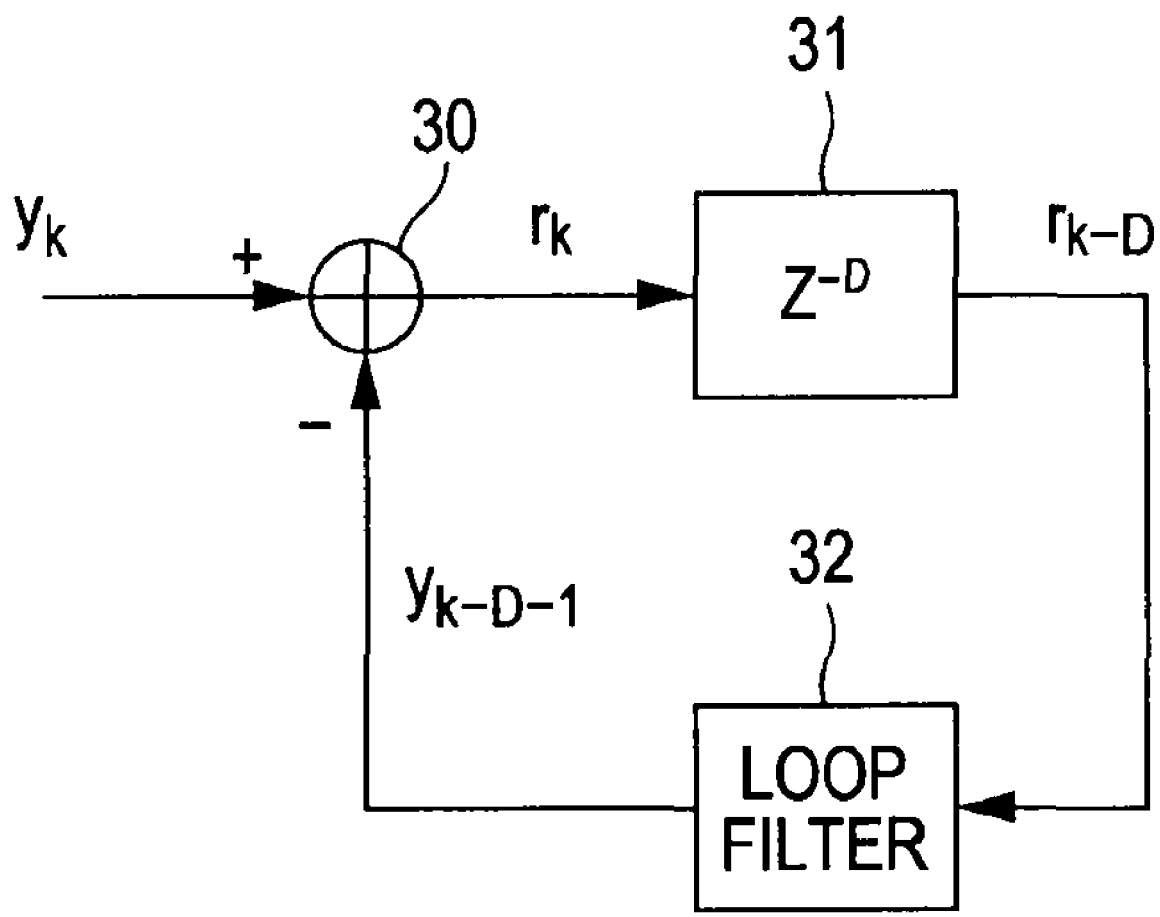
FIG. 4 shows an exemplary model of a feedback unit in which loop delays are collected immediately after the portion where a target difference is detected.

FIG. 4 shows an exemplary model of a control unit in which the loop delay occurs in the feedback loop. In the model of the control unit in FIG. 4, all the loop delay components (a delay block 31 in FIG. 4) are collectively provided immediately after the portion where the target difference is detected. Referring to FIG. 4, the input into the feedback loop is denoted by "$y_k$", the output from a subtraction block 30 to detect the difference is denoted by "$r_k$", the output from the delay block 31 is denoted by "$r_{k-D}$", the output from a loop filter 32 is denoted by "$y_{k-D-1}$".

The difference from the target value is expressed by Equation (3):

$$r_{k+1} = y_k - y_{k-D-1} \tag{3}$$

Here, a model controlled by "$r_{k-D}$" will now be considered as the system unit in the state space. Modification of Equation (1) with the second statistical term of the right side of Equation (1) disregarded result in Equation (4):

$$x_{k+1} = F x_{k-D-1} + F K_k^\Delta r_k^\Delta \tag{4}$$

The loop delay is considered in the second term of the right side of Equation (4). The second term is defined by Equations (5) and (6):

$$K_k^\Delta = F_k^\Delta K_{k-D} u(k-\tau) \tag{5}$$

$$\begin{aligned} r_k^\Delta &= y_{k-D} - y_{k-D-1} \\ &= (y_{k-D} - y_{k-2D-1}) + (y_{k-2D-1} - y_{k-D-1}) \\ &= r_{k-D} + y_{k-2D-1} - HF^{-D} x_{k-D-1} \end{aligned} \tag{6}$$

In Equation (5), "$k_k$" denotes the gain of the loop filter at a time k and "u(k)" denotes a step function. Equation (6) represents the purpose of the compensation of the loop delay. Specifically, the loop delay is controlled by using a target difference corresponding to one time difference of the control value on the assumption that no loop delay occurs ideally. However, since the difference obtained in the actual unit is denoted by "$r_{k-D}$", "$r_{k-D}$" is used to represent one time difference of "$y_{k-D}$".

It is important here to vary the configuration of the loop filter in accordance with Equation (6). It is also important here that the gain of the loop filter can be appropriately varied in accordance with Equation (5) to correct the loop delay.

Next, application to the PLL model of a secondary control loop will be considered. Since the phase and the frequency are controlled in a secondary delay unit, a state space having a vector expressed by Equation (7) should be considered.

$$x_k = \begin{pmatrix} \theta_k \\ f_k \end{pmatrix} \tag{7}$$

where "$\theta_k$" denotes phase and "$f_k$" denotes frequency.

Since the phase control is performed in the observation unit, $y_k = \theta_k$. Accordingly, the observation matrix "H" is expressed by Equation (8):

$$H = (1\ 0) \tag{8}$$

In the convergence state in which no disturbance occurs in Equation (1), the system matrix "F" is expressed by Equation (9):

$$F = \begin{pmatrix} 1 & 1 \\ 0 & 1 \end{pmatrix} \tag{9}$$

Consequently, Equation (6), that is, the arithmetic expression for compensating the loop delay can be expressed by Equation (10) in a secondary PLL:

$$r_k^\Delta = r_{k-D} + \theta_{k-2D-1} - \theta_{k-D-1} + D \cdot f_{k-D-1} \tag{10}$$

Figure 5:
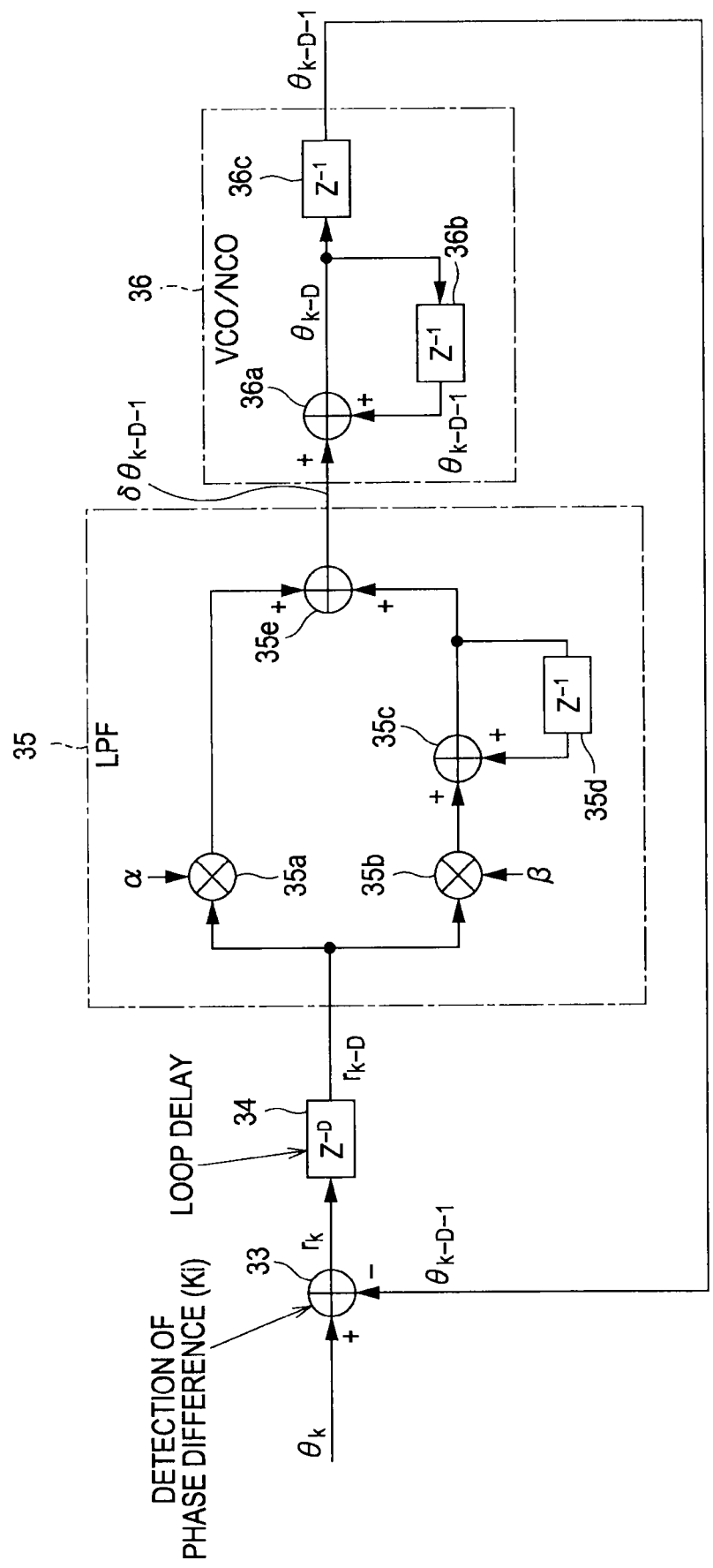
FIG. 5 shows an example of a general PLL model.

The secondary PLL is generally expressed by a model shown in FIG. 5. In the model in FIG. 5, the loop delay components are collectively provided immediately after the portion where the phase difference is detected.

The phase "$\theta_k$" is input into the PLL model in FIG. 5. The input "$\theta_k$" is input into a subtraction block 33 for detecting the phase difference. A loop delay is given to an output "$r_k$" from the subtraction block 33 by a delay block 34. An output $r_{k-D}$ from the delay block 34 is supplied to an LPF 35 (loop filter).

The loop delay given by the delay block 34 collectively represents all the delay components, such as the pipeline delay, occurring in the feedback control loop (closed loop). For example, although the PR equalizer 21 is included in the feedback control loop in the configurations shown in FIGS. 2 and 3, the PR equalization by the PR equalizer 21 contributes to an improvement of the performance of the detection of the phase difference. Accordingly, in terms of a transfer function, the PR equalization by the PR equalizer 21 is only represented as the delay component. The amount "D" of the loop delay given by the delay block 34 includes such a delay by the PR equalizer 21.

Referring to FIG. 5, the LPF 35 includes a multiplication block 35a multiplying the output $r_{K-D}$ from the delay block 34 by a coefficient α (proportional filter: frequency control side). The LPF 35 also includes a multiplication block 35b multiplying the output $r_{K-D}$ from the delay block 34 by a coefficient β, an addition block 35c integrating the output from the multiplication block 35b, and a delay block 35d (integration filter: phase control side). As shown in FIG. 5, the addition block 35c adds the output from the multiplication block 35b to the component given by delaying the output from the addition block 35c by one time by the delay block 35d.

The LPF 35 further includes an addition block 35e adding the output from the multiplication block 35a to the output from the addition block 35c.

The output from the addition block 35e is output from the LPF 35. The output from the LPF 35 is denoted by "$\delta\theta_{K-D-1}$", as shown in FIG. 5.

The output "$\delta\theta_{K-D-1}$" from the LPF 35 is input into a VCO/NCO 36 resulting from modeling of the VCO 26 in FIG. 2 or the NCO 29 in FIG. 3. The VCO/NCO 36 includes an addition block 36a integrating the output "$\delta\theta_{K-D-1}$", a delay block 36b, and a delay block 36c giving a delay corresponding to one time to the output from the addition block 36a. The addition block 36a adds the output "$\delta\theta_{K-D-1}$" from the LPF 35 to the component given by delaying the output "$\theta_{K-D}$" from the addition block 36a by one time by the delay block 36b. The delay corresponding to one time is given to the output "$\theta_{K-D}$" from the addition block 36a by the delay block 36c and the resulting value is output from the VCO/NCO 36. The output from the VCO/NCO 36 is denoted by "$\theta_{K-D-1}$".

As apparent from FIG. 5, when the VCO 26 in FIG. 2 and the NCO 29 in FIG. 3 are modeled, the VCO 26 in FIG. 2 and the NCO 29 in FIG. 3 are represented by simple integration.

The output "$\theta_{K-D-1}$" from the VCO/NCO 36 is input into the subtraction block 33 described above. The subtraction block 33 subtracts the output "$\theta_{K-D-1}$" supplied from the VCO/NCO 36 from the input "$\theta_k$".

The technologies in the related art proposed in U.S. Pat. No. 6,236,343 and Reference Documents 1 and 2 modify the PLL model represented in the above manner so that the PLL model satisfies Equation (10) to realize the compensation of the loop delay.

Figure 6:
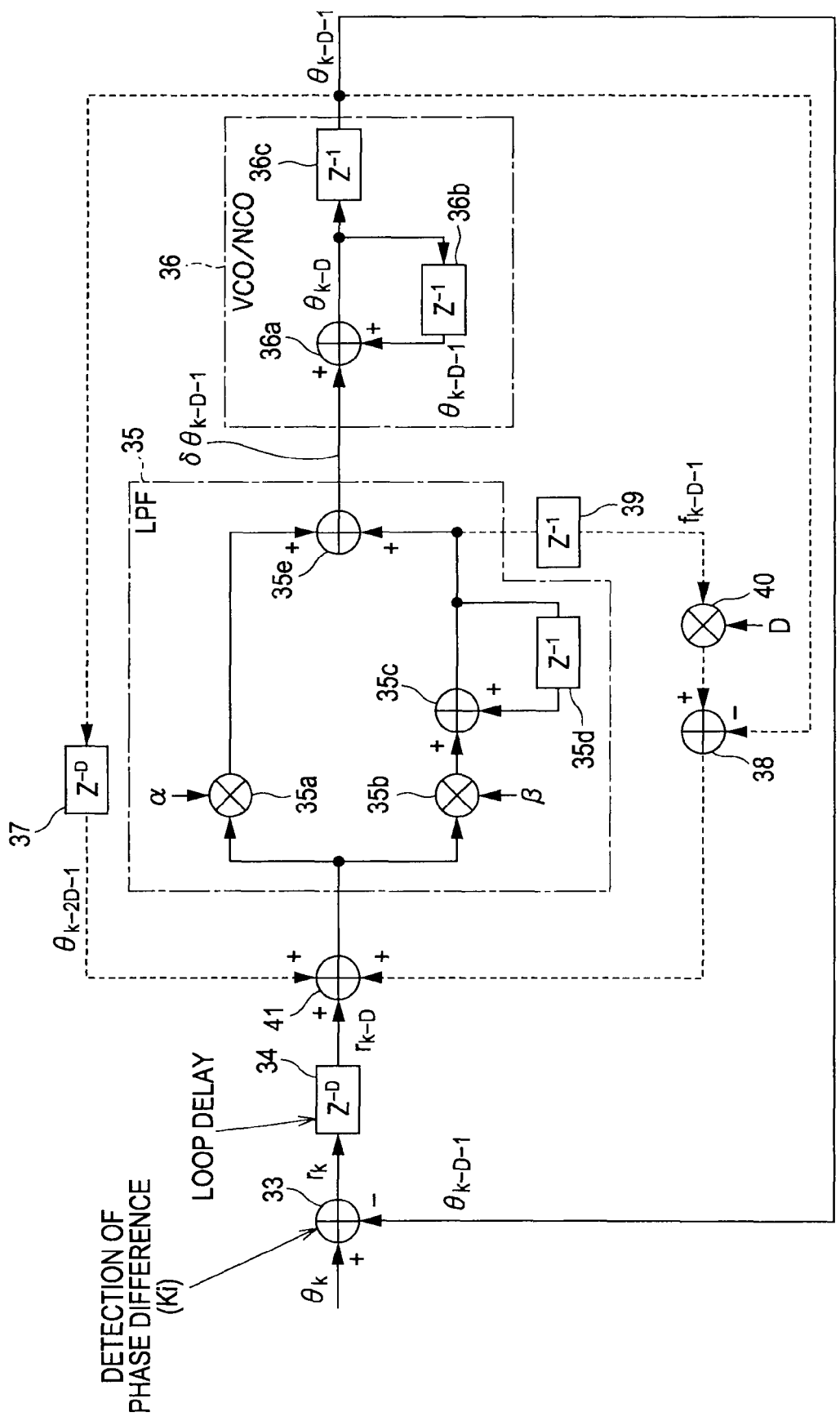
FIG. 6 shows an example of a PLL model in related art when the loop delay is compensated.

FIG. 6 shows a specific example of the PLL model in the related art.

The PLL model in the related art shown in FIG. 6 is given by adding lines indicated by broken lines to the PLL model shown in FIG. 5. Specifically, the PLL model in FIG. 6 includes an addition block 41 provided between the delay block 34, which serve as the loop delay, and the LPF 35. The addition block 41 feeds back the following three components to the input into the LPF 35. Specifically, a line including the VCO/NCO 36, a delay block 37, and the addition block 41 positively feeds back "$\theta_{K-2D-1}$" resulting from giving the loop delay to the output "$\theta_{K-D-1}$" from the VCO/NCO 36. A line including the VCO/NCO 36, a subtraction block 38, and the addition block 41 negatively feeds back the output "$\theta_{K-D-1}$" from the VCO/NCO 36. A line including a delay block 39, a multiplication block 40, the subtraction block 38, and the addition block 41 positively feeds back a component "$D \cdot f_{K-D-1}$" given by multiplying the component "$f_{K-D-1}$" resulting from delaying the output from the addition block 35c in the LPF 35 by one time by the amount "D" of the loop delay, which is the gain. In other words, the component given by multiplying the integration term of the LPF 35 by the amount "D" of the loop delay, which is the gain, is positively fed back.

The model satisfying Equation (10) shown in FIG. 6 can be used to compensate the loop delay.

However, the PLL model in FIG. 6 is only a model and the following problems can be caused when the PLL circuit is configured on the basis of the PLL model in FIG. 6.

Figure 7:
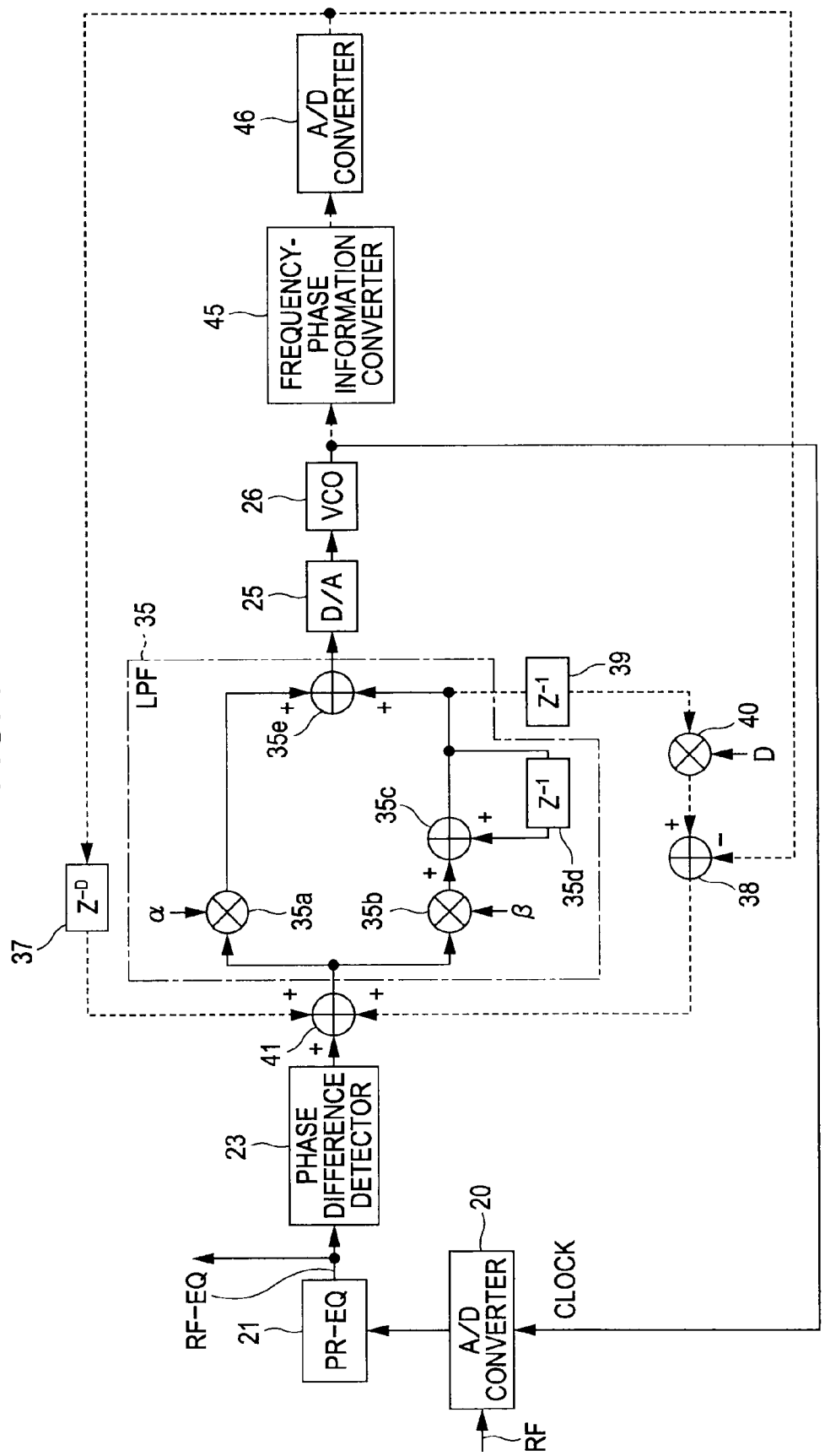
FIG. 7 shows an example of an actual circuit configuration using the VCO when the compensation of the loop delay is performed on the basis of the PLL model in the related art.

FIG. 7 shows an exemplary actual configuration when the PLL circuit using the VCO 26 shown in FIG. 2 is realized on the basis of the model shown in FIG. 6. The same reference numerals are used in FIG. 7 to identify the same components shown in FIG. 2. A description of such components is omitted herein.

The configuration in FIG. 7 differs from the configuration in FIG. 2 in that the loop filter corresponding to the LPF 35 in FIG. 6 is provided, instead of the LPF 24. The configuration in FIG. 7 differs from the configuration in FIG. 2 also in that the components corresponding to the delay block 37, the delay block 39, the multiplication block 40, the subtraction block 38, and the addition block 41 (hereinafter referred to as a delay device 37, a delay device 39, a multiplier 40, a subtractor 38, and an adder 41), which are shown in FIG. 6 and used for compensating the loop delay, are provided. In the actual configuration, a frequency-phase information converter 45 and an A/D converter 46 are added to the line to supply the output from the VCO 26 to the delay block 37 and the subtraction block 38.

The output from the VCO 26 is frequency control information. In contrast, information processed by the loop filter (the LPF 35) is phase information. Accordingly, it is necessary to physically measure the edge position of the signal output from the VCO 26, which is the frequency control signal, and to convert the measured edge position into information about the amount of phase in the actual configuration in order to feed back the output from the VCO 26 to the input into the loop filter. This is the reason for the provision of the frequency-phase information converter 45 performing conversion between frequency information and the phase information.

However, it is very difficult to actually configure the frequency-phase information converter 45.

Figure 8:
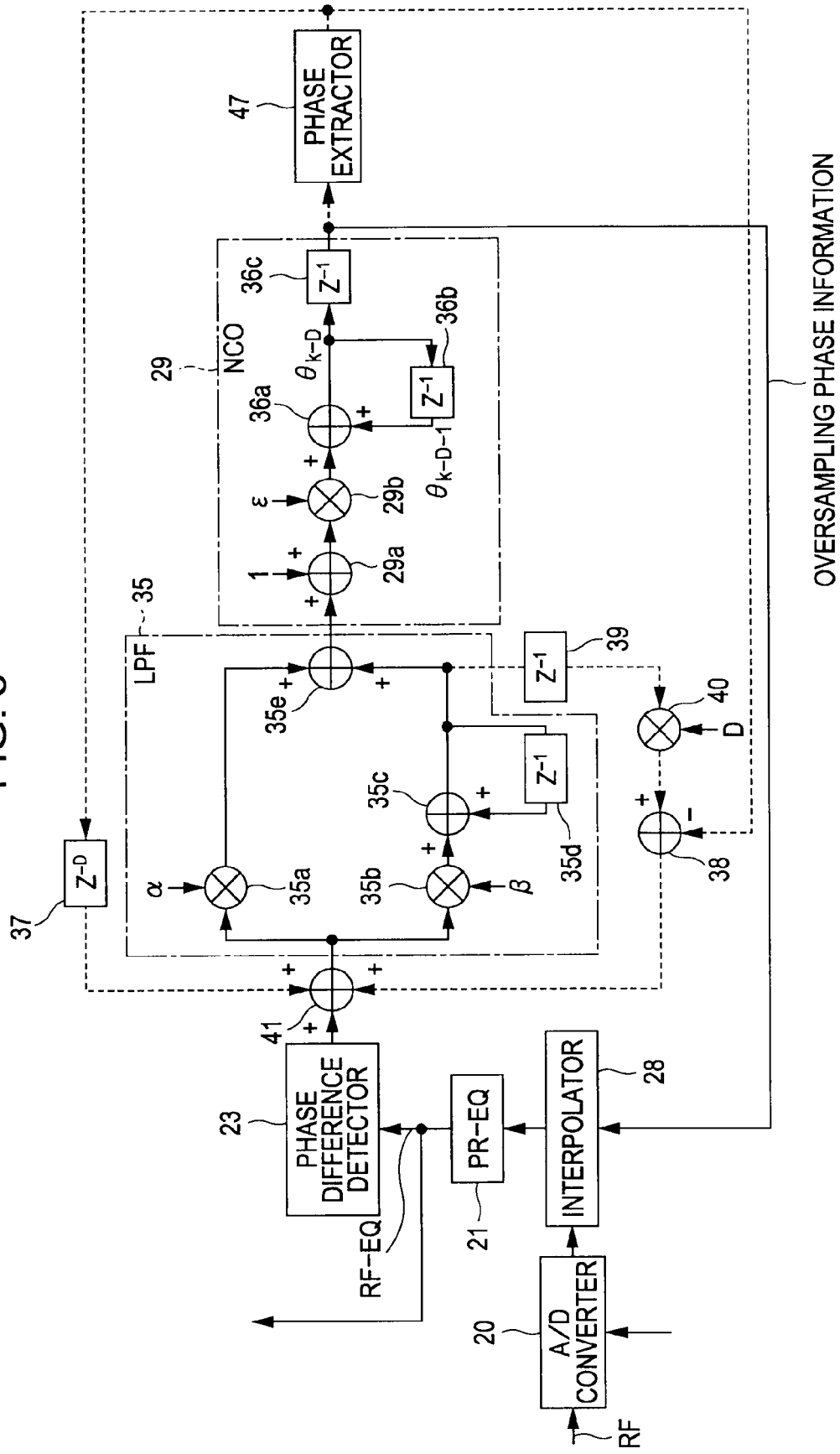
FIG. 8 shows an example of an actual circuit configuration adopting the ITR method when the compensation of the loop delay is performed on the basis of the PLL model in the related art.

FIG. 8 shows an exemplary actual configuration when the PLL circuit adopting the ITR method shown in FIG. 3 is realized on the basis of the model shown in FIG. 6. The same reference numerals are used in FIG. 8 to identify the same components shown in FIG. 3. A description of such components is omitted herein.

The configuration in FIG. 8 differs from the configuration in FIG. 3 in that the LPF 35 in FIG. 6 is provided, instead of the LPF 24. The configuration in FIG. 8 differs from the configuration in FIG. 3 also in that the components corresponding to the delay block 37, the delay block 39, the multiplication block 40, the subtraction block 38, and the addition block 41 (the delay device 37, the delay device 39, the multiplier 40, the subtractor 38, and the adder 41), which are shown in FIG. 6 and used for compensating the loop delay, are provided.

When the NCO 29 is represented as the actual component, instead of the transfer function block, an adder 29a and a multiplier 29b are provided in the NCO 29, in addition to the addition block 36a, the delay block 36b, and the delay block 36c shown in FIG. 6 (hereinafter referred to as an adder 36a, a delay device 36b, and a delay device 36c). Specifically, the output from the LPF 35 is input into the adder 36a through the adder 29a and the multiplier 29b in the NCO 29. The adder 29a adds "1" to the output from the LPF 35. The multiplier 29b multiplies the output from the adder 29a by a coefficient ε.

In the ITR method, the sampling of the RF signal by the A/D converter 20 is performed at a fixed oversampling frequency. Accordingly, in the actual calculation by the NCO 29, the integration at an oversampling rate is performed and, then, residue calculation is performed for conversion into the amount of phase at the edge within the clock period, as shown in Equation (11):

$$\theta_{k+1} = [\theta_k + \epsilon(1-\delta\theta_k)]_{mod-1} \qquad (11)$$

where the coefficient ε denotes the oversampling rate and "mod$_{-1}$" denotes the residue calculation by using an integer "1". For example, if the oversampling rate is 1.1 times higher than the data rate, the coefficient ε is set to "1.1".

The adder 29a and the multiplier 29b are provided in the NCO 29 to realize such a calculation.

In the PLL circuit adopting the ITR method, it is necessary to provide a phase extractor in a line that feeds back the output from the NCO 29 for compensating the loop delay, as shown in FIG. 8.

Figure 9:
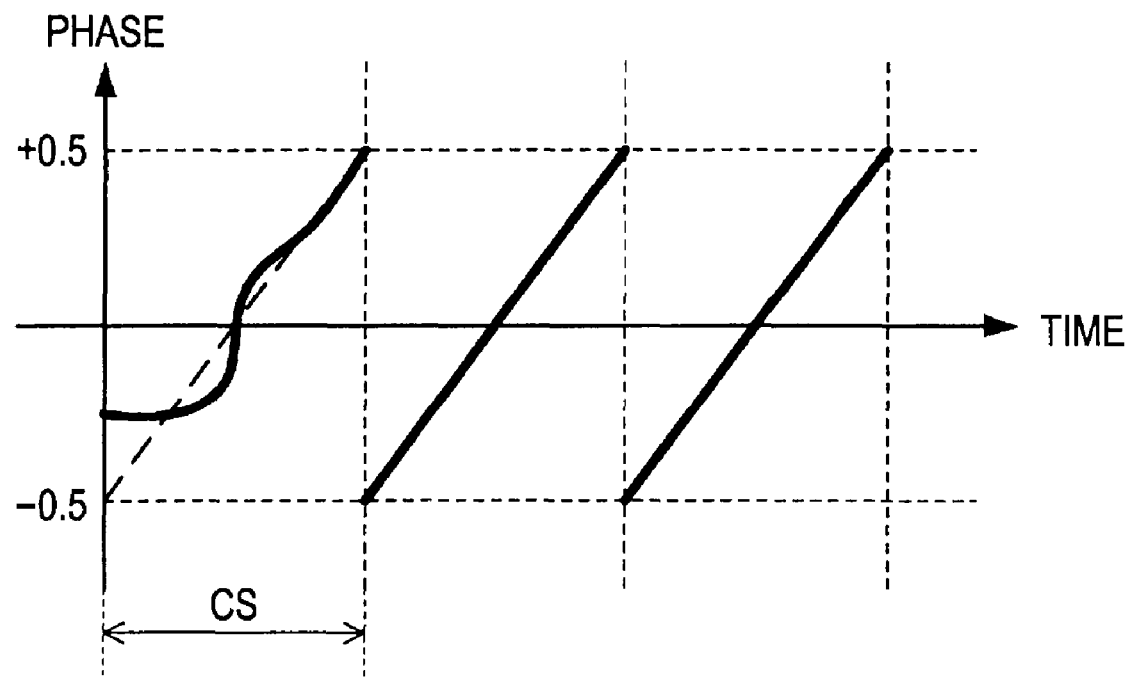
FIG. 9 is a graph for description of oversampling phase information.

As apparent from the above description, the output from the NCO 29 is information indicating the amount of phase within one period of the oversampling clock (oversampling phase information). FIG. 9 shows an example of the oversampling phase information. Referring to FIG. 9, the information output from the NCO 29 indicates the phases for every period "cs" of the oversampling clock.

The oversampling phase information should indicate the phases within a certain range (window) when overflow and underflow are considered in the actual circuit implementation. For example, the oversampling phase information within a range from −0.5 to +0.5 is represented in the example in FIG. 9. In other words, the oversampling phase information is subjected to phase jump in which, for example, the phase is expressed from −0.5 in the next period when the phase level reaches +0.5.

Figure 10:
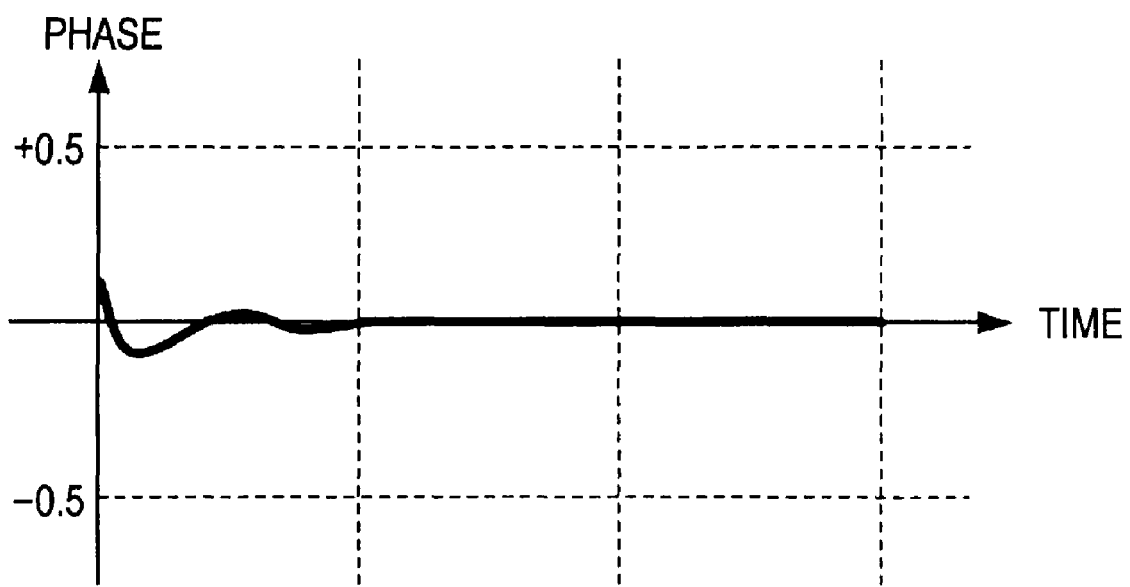
FIG. 10 is a graph for description of phase information to be processed in a loop filter.

In contrast, the LPF 35 processes normal phase information (phase information without oversampling) shown in FIG. 10. In other words, the LPF 35 processes information indicating the amount of phase at each time.

Accordingly, in order to feed back the output from the NCO 29 to the input into the loop filter for the compensation of the loop delay, it is necessary to provide a phase extractor 47 that converts, for example, the oversampling phase information shown in FIG. 9 into the normal phase information shown in FIG. 10.

However, it is also very difficult to realize the phase extractor 47 in the actual configuration. Specifically, it is necessary to perform an inverse operation of Equation (11), which is very complicated, in order to convert the phase jump information in FIG. 9 in which the phase is jumped at a certain period into the normal phase information shown in FIG. 10. It is very difficult to realize such an operation.

As described above, it is very difficult to realize the PLL model in the related art shown in FIG. 6 for compensating the loop delay when the actual circuit implementation is considered. Even if it is possible to realize the PLL model in the related art shown in FIG. 6, it is necessary to perform the very complicated process. Accordingly, it is difficult to realize the configuration for compensating the loop delay with the PLL model in the related art shown in FIG. 6.

Compensation of Loop Delay According to An Embodiment of The Present Invention

The above problems in the related art are caused by the feedback of the output from the VCO or NCO to the loop filter in the compensation of the loop delay.

For this reason, the assignee of the present application modified Equation (10) to attempt to introduce a model in which the feedback of the output from the VCO or NCO into the loop filter is not necessary.

In the introduction of such a model, the assignee of the present application paid attention to the VCO/NCO 36, which is the transfer function block. Z conversion focusing on only the delay component of the VCO/NCO 36 results in Equation (12):

$$\frac{Z^{-1}}{1-Z^{-1}} \quad (12)$$

The term for the delay compensation in Equation (10) will now be modified on the basis of the above assumption.

The term for the delay compensation in Equation (10), expressed by Equation (13), is modified into Equation (14) on the basis of "$\theta_{K-D-1}$":

$$\theta_{k-D-1} \cdot Z^{-D} - \theta_{k-D-1} + D \cdot f_{k-D-1} \quad (13)$$

$$D \cdot f_{k-D-1} - (1-Z^{-D}) \cdot \theta_{k-D-1} \quad (14)$$

According to FIG. 6, the fourth term "$\theta_{K-D-1}$" of Equation (14) results from multiplication of the output "$\delta\theta_{K-D-1}$" from the LPF 35 by the transfer function of the VCO/NCO 36. Accordingly, Equation (14) can be expressed by Equation (15) using Equation (12):

$$D \cdot f_{k-D-1} - (1-Z^{-D}) \cdot \frac{Z^{-1} \cdot \delta\theta_{k-D-1}}{(1-Z^{-1})} \quad (15)$$

Factorization of the third term $(1-Z^{-D})$ of Equation (15) results in Equation (16):

$$D \cdot f_{k-D-1} - (1-Z^{-1}) \cdot (1+Z^{-1}+Z^{-2}+\ldots+Z^{-(D-1)}) \cdot \frac{Z^{-1} \cdot \delta\theta_{k-D-1}}{(1-Z^{-1})} \quad (16)$$

Equation (16) can be modified into Equation (17):

$$D \cdot f_{k-D-1} - \left(\sum_{i=1}^{D} Z^{-i}\right) \cdot \delta\theta_{k-D-1} \quad (17)$$

According to Equation (17), the output from the VCO or the NCO is not necessary for the delay compensation, and the term for the delay compensation can be expressed only on the basis of the components in the loop filter.

Figure 11:
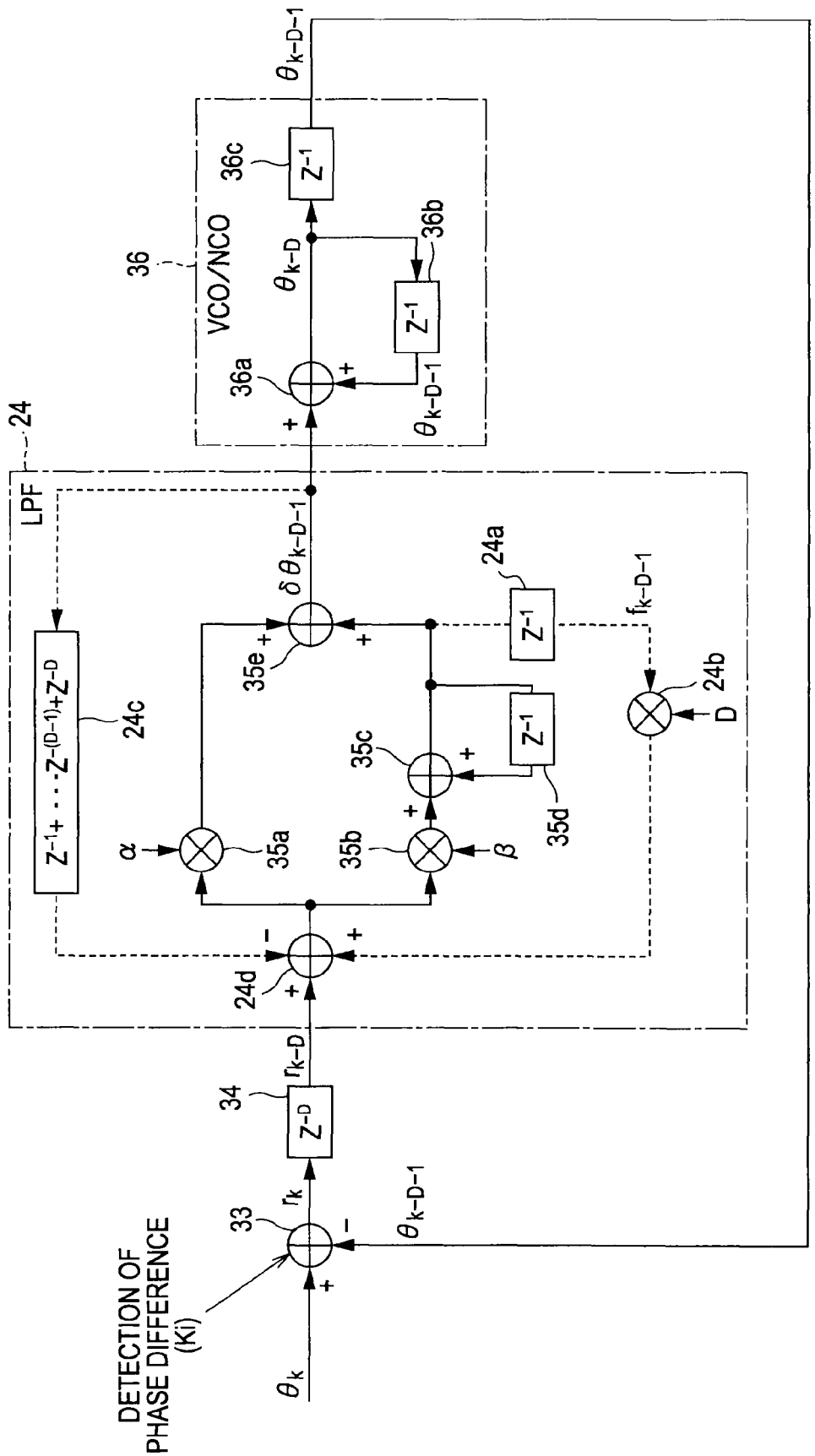
FIG. 11 shows an example of a PLL model according to an embodiment of the present invention with the compensation of the loop delay.

FIG. 11 shows an exemplary model of a closed loop in accordance with Equation (17) according to an embodiment of the present invention.

The same reference numerals are used in FIG. 11 to identify the same components shown in FIG. 6. A description of such components is omitted herein.

The PLL model according to the embodiment of the present invention in FIG. 11 includes a moving average block 24c, a delay block 24a, a multiplication block 24b, and an addition and subtraction block 24d. The moving average block 24c gives the transfer function indicated by the third term of Equation (17) to the output "$\delta\theta_{K-D-1}$" from the LPF 35 shown in FIGS. 5 and 6, including the multiplication block 35a, the multiplication block 35b, the addition block 35c, the delay block 35d, and the addition block 35e (hereinafter referred to as loop filter blocks). The delay block 24a and the multiplication block 24b receive the output from the addition block 35c in the loop filter blocks to obtain the components for the first and second terms of Equation (17). The addition and subtraction block 24d feeds back the output from the moving average block 24c and the output from the multiplication block 24b to the input into the loop filter blocks in accordance with Equation (17).

The moving average block 24c folds the signal characteristics represented by the third term of Equation (17) into the output "$\delta\theta_{K-D-1}$". Specifically, the moving average block 24c calculates the moving average of the outputs "$\delta\theta_{K-D-1}$" of a number "D−1". In other words, the moving average block 24c calculates the moving average of the outputs "$\delta\theta_{K-D-1}$" of a number "the amount of delay in the entire closed loop −1".

The delay block 24a gives a delay corresponding to one time to the output from the addition block 35c. The multiplication block 24b multiplies the output from the delay block 24a by the amount "D" of the loop delay, which is the gain.

The addition and subtraction block 24d receives the output "$r_{K-D}$" from the delay block 34 to subtract the output from the moving average block 24c from the output "$r_{K-D}$" and to add the output from the multiplication block 24b to the output "$r_{K-D}$". The output from the addition and subtraction block 24d is supplied to the multiplication block 35a and the multiplication block 35b in the loop filter blocks.

The LPF 24 in the PLL model in FIG. 11 includes the moving average block 24c, the delay block 24a, the multiplication block 24b, and the addition and subtraction block 24d for the delay compensation, in addition to the loop filter blocks, for convenience of the graphic representation. However, only the loop filter blocks may be considered as the LPF 24, as in the PLL models in FIGS. 5 and 6.

Figure 12:
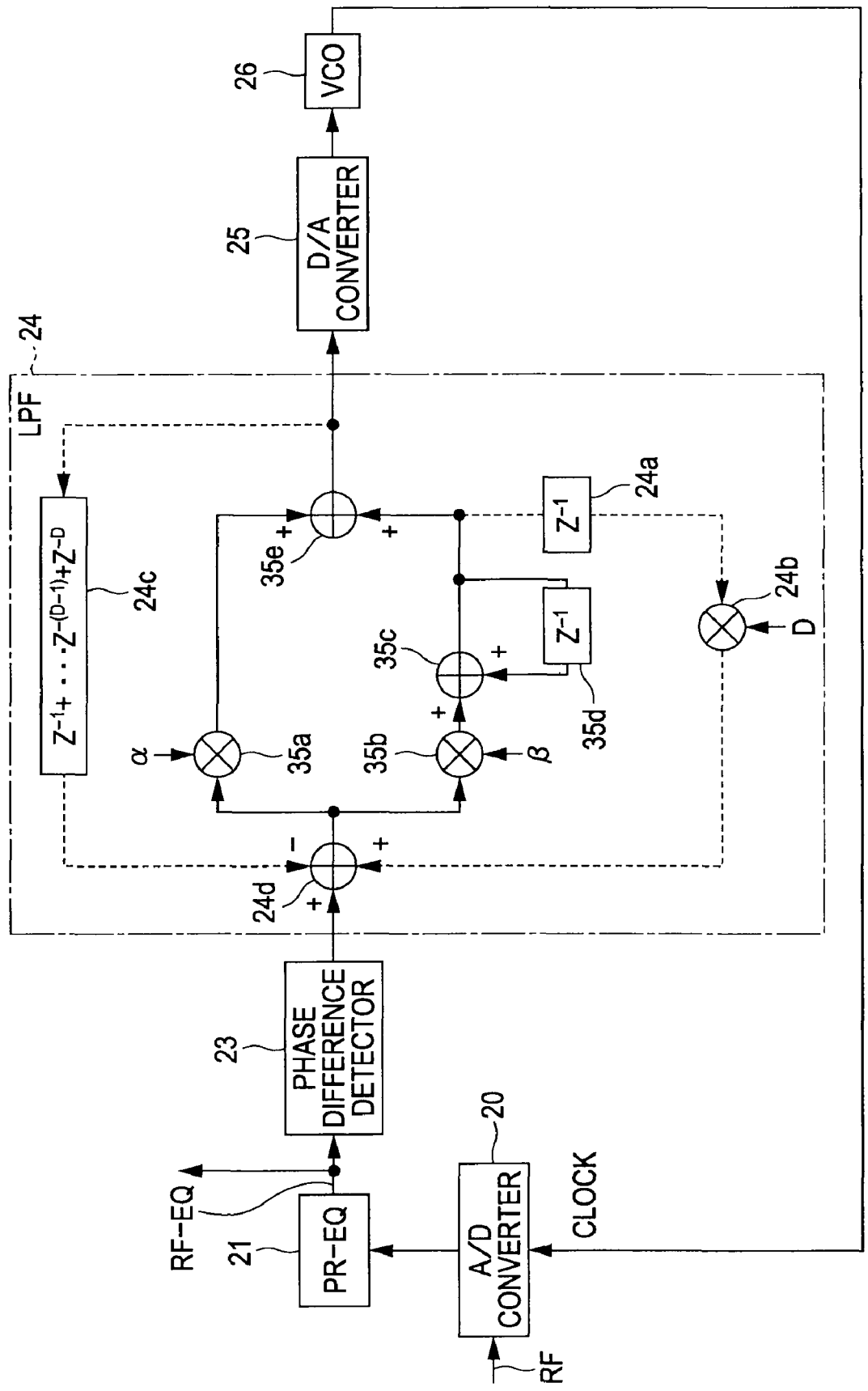
FIG. 12 shows an example of an actual circuit configuration using the VCO when the compensation of the loop delay is performed on the basis of the PLL model according to the embodiment of the present invention.
Figure 13:
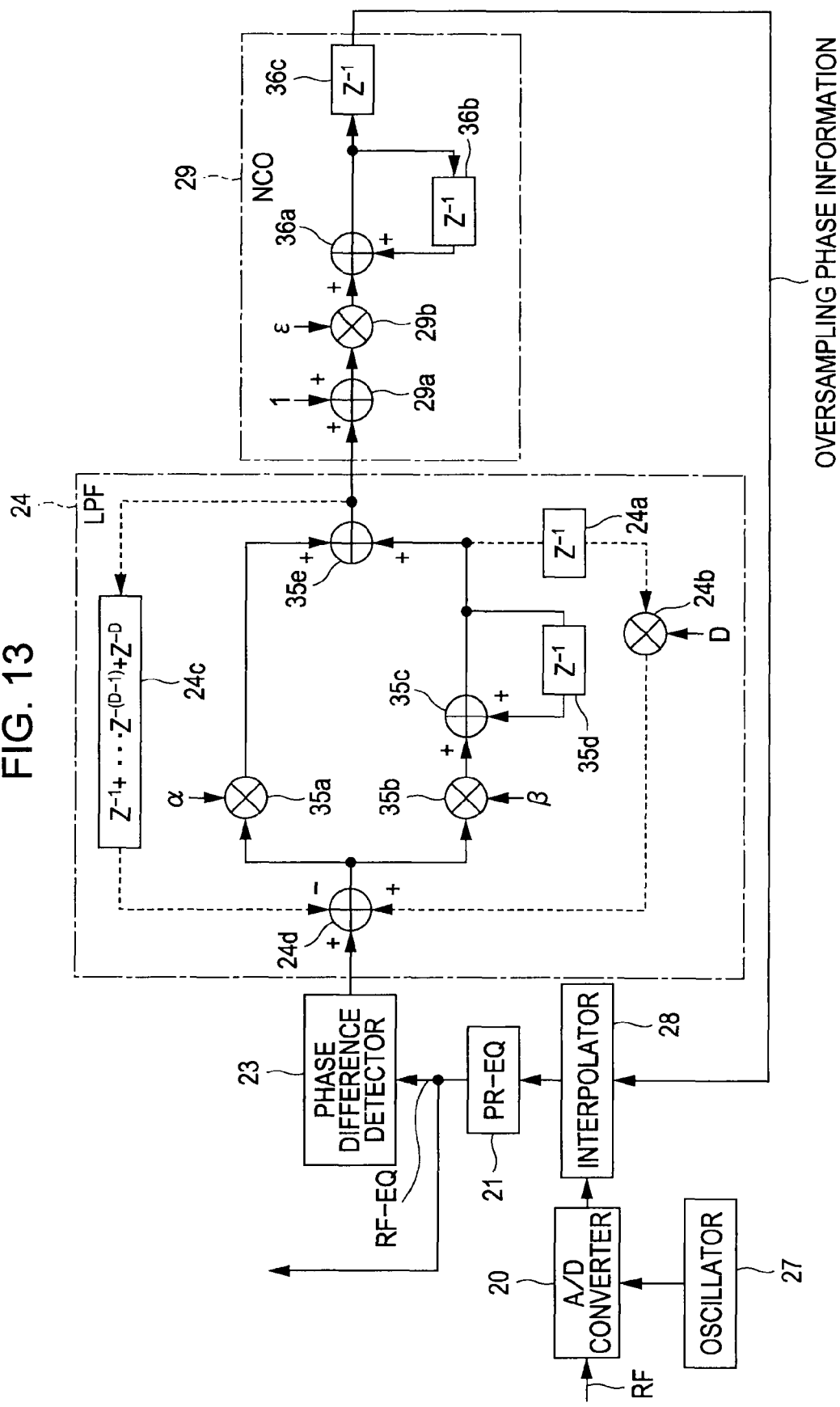
FIG. 13 shows an example of an actual circuit configuration adopting the ITR method when the compensation of the loop delay is performed on the basis of the PLL model according to the embodiment of the present invention.

FIGS. 12 and 13 show exemplary configurations of an actual PLL circuit in the compensation of the loop delay based on the PLL model shown in FIG. 11.

FIG. 12 shows an exemplary configuration when the VCO 26 is used. FIG. 13 shows an exemplary configuration when the ITR method is adopted. The same reference numerals are used in FIGS. 12 and 13 to identify the same components described above. A description of such components is omitted herein.

In the configuration in FIG. 12 using the VCO 26, the LPF 24 in the configuration in FIG. 2 is configured so as to perform the calculation represented by each block in the LPF 24 in FIG. 11. Specifically, in the LPF 24 in FIG. 12, the components corresponding to the multiplication block 35a, the multiplication block 35b, the addition block 35c, the delay block 35d, the addition block 35e, the moving average block 24c, the delay block 24a, the multiplication block 24b, and the addition and subtraction block 24d in FIG. 11 (hereinafter referred to as a multiplier 35a, a multiplier 35b, an adder 35c, a delay device 35d, an adder 35e, a moving average calculator 24c, a delay device 24a, a multiplier 24b, and an adder and subtractor 24d) are connected to each other in the manner shown in FIG. 11.

In this case, for example, an FIR filter is used as the moving average block 24c.

Also in the configuration in FIG. 13 adopting the ITR method, the LPF 24 in the configuration shown in FIG. 3 is configured in the same manner as in the LPF 24 in FIG. 12.

The NCO 29 in FIG. 13 has the same internal configuration as the one described above with reference to FIG. 8.

As apparent from FIGS. 12 and 13, the compensation of the loop delay can be performed within the LPF 24 on the basis of the PLL model according to the embodiment of the present invention. In the configuration using the VCO 26, it is not necessary to provide the frequency-phase information converter 45 that physically measures the clock period. In the configuration adopting the ITR method, it is not necessary to provide the phase extractor 47 that performs the complicated inverse operation of Equation (11).

Accordingly, according to the embodiments of the present invention, it is possible to realize the PLL circuit that achieves both the increase in the processing speed and the improvement in the convergence performance by compensating the loop delay.

Simulation Results

The advantages of the PLL circuits according to the embodiments of the present invention will now be described.

Although simulation results of the PLL circuit adopting the ITR method shown in FIG. 13 will be described, similar simulation results can be achieved also in the PLL circuit using the VCO 26 shown in FIG. 12.

In the following simulation, a PR(1, 2, 1) ideal waveform is input into the PLL circuit. The PR(1, 2, 1) ideal waveform results from folding of data given by performing Non Return to Zero (NRZ) modulation to a modulation code 1-7PP(RLL (1, 7)PP, RLL: Run Length Limited, PP: Parity Preserve/ Prohibit) with PR(0.25, 0.5, 0.25). The oversampling rate is set to "1.05" in the following simulation.

In general, the behavior of the secondary PLL can be represented by using a dumping factor $\zeta$ and an angular natural frequency $\omega_n$. The values of the factors $\alpha$ and $\beta$ of the loop filters in FIGS. 12 and 13 can be uniquely determined by Equations (18) and (19) for the behavior:

$$\beta = \frac{\omega_n^2}{Ki} \quad (18)$$

$$\alpha = \frac{2\zeta\omega_n}{Ki} \quad (19)$$

where "$K_i$" denotes a phase difference gain and can be experimentally measured in advance for the 1-7PP random pattern. The "K" is equal to "0.49274" in the above case.

Figure 14:
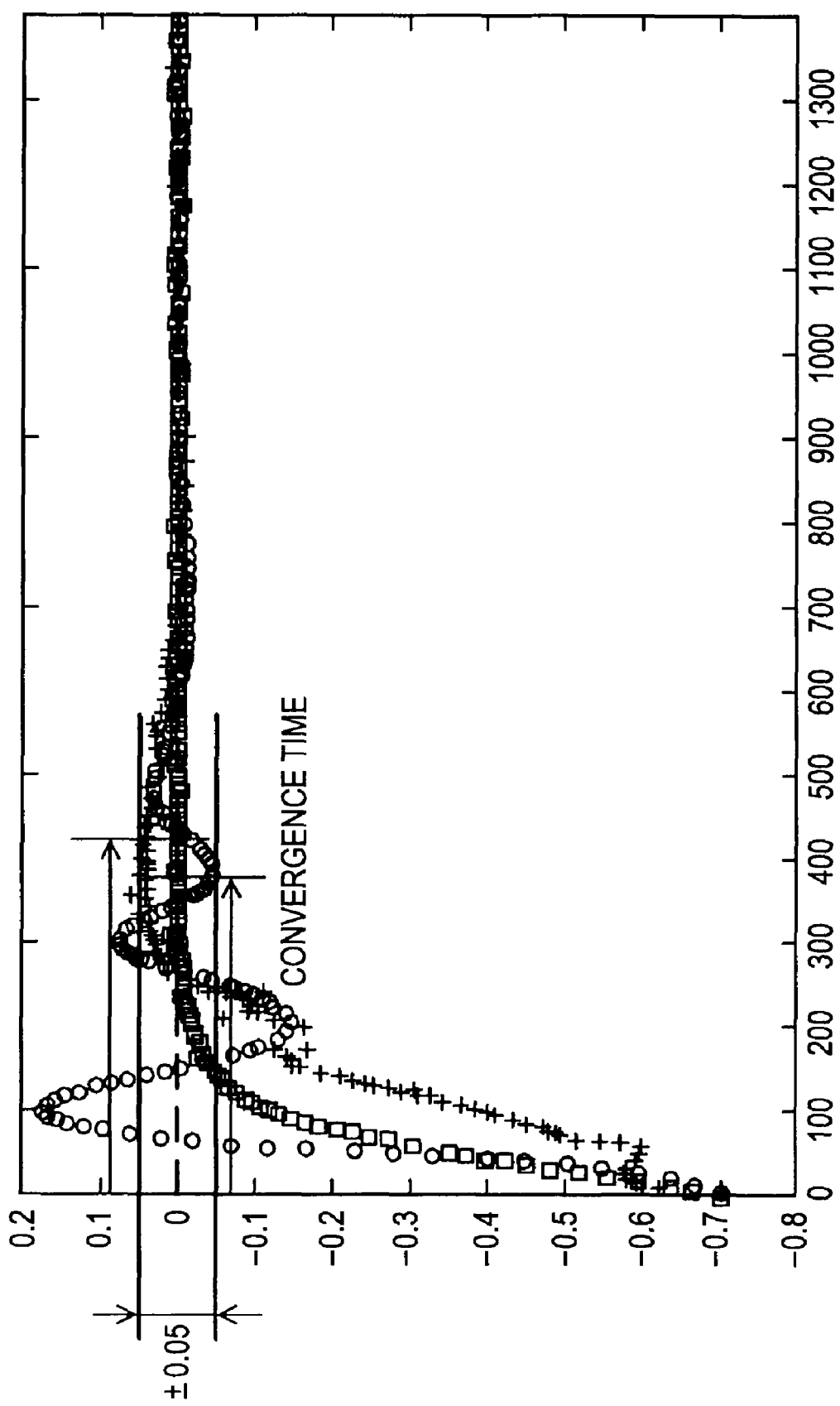
FIG. 14 is a graph for description of simulation results of convergence characteristics in the PLL model according to the embodiment of the present invention.

FIG. 14 shows simulation results of the convergence characteristics.

Referring to FIG. 14, the horizontal axis represents time and the vertical axis represents convergence characteristics of the PLL, which are the phase differences (the behavior of the result of the detection of the phase differences).

The simulation results when the frequency difference is equal to −0.5% are shown in FIG. 14. The frequency difference is defined by a ratio of the difference between the frequency of the data included in the input waveform and the central frequency set for the PLL in advance with respect to the central frequency.

Referring to FIG. 14, a curve plotted with cross-shaped points indicates the simulation result of the PLL circuit according to the embodiment of the present invention. In order to attain this simulation result, the PLL constant $\xi$ is set to "1.5" and the PLL constant $\omega_n$ is set to 2.273E-02[rad/sec] (the sampling frequency is normalized as "1.0"). The amount of the loop delay is set to "30" (D=30).

A curve plotted with circular points is shown for comparison and indicates the simulation result when the delay compensation is not performed with the amount of the loop delay set to "30" (D=30). In order to attain this simulation result, the PLL constant $\xi$ is set to "1.0" and the PLL constant $\omega_n$ is set to 1.515E-02[rad/sec].

A curve plotted with square points is shown for reference and indicates the simulation result when no loop delay occurs (D=0). The PLL constant $\xi$ is set to "1.0" and the PLL constant $\omega_n$ is set to 1.515E-02[rad/sec].

When no loop delay occurs, the behavior without overshoot should normally be exhibited, as in the curve plotted with the square points. However, when the loop delay occurs and the delay compensation is not performed (the curve plotted with the circular points), oscillatory components appear and the control state becomes unstable.

In contrast, when the delay compensation according to the embodiment of the present invention is performed and the PLL constants are appropriately set, the good behavior in which the unstable oscillatory components are suppressed can be achieved, as in the curve plotted with the cross-shaped points.

Since the unstable components are suppressed, the convergence time according to the embodiment of the present invention becomes shorter than that in the case where the compensation of the loop delay is not performed, as shown by arrows in FIG. 14.

The convergence time in this case is defined as the time during which the result of the detection of the phase difference is converged into a range of +0.05%.

Figure 15:
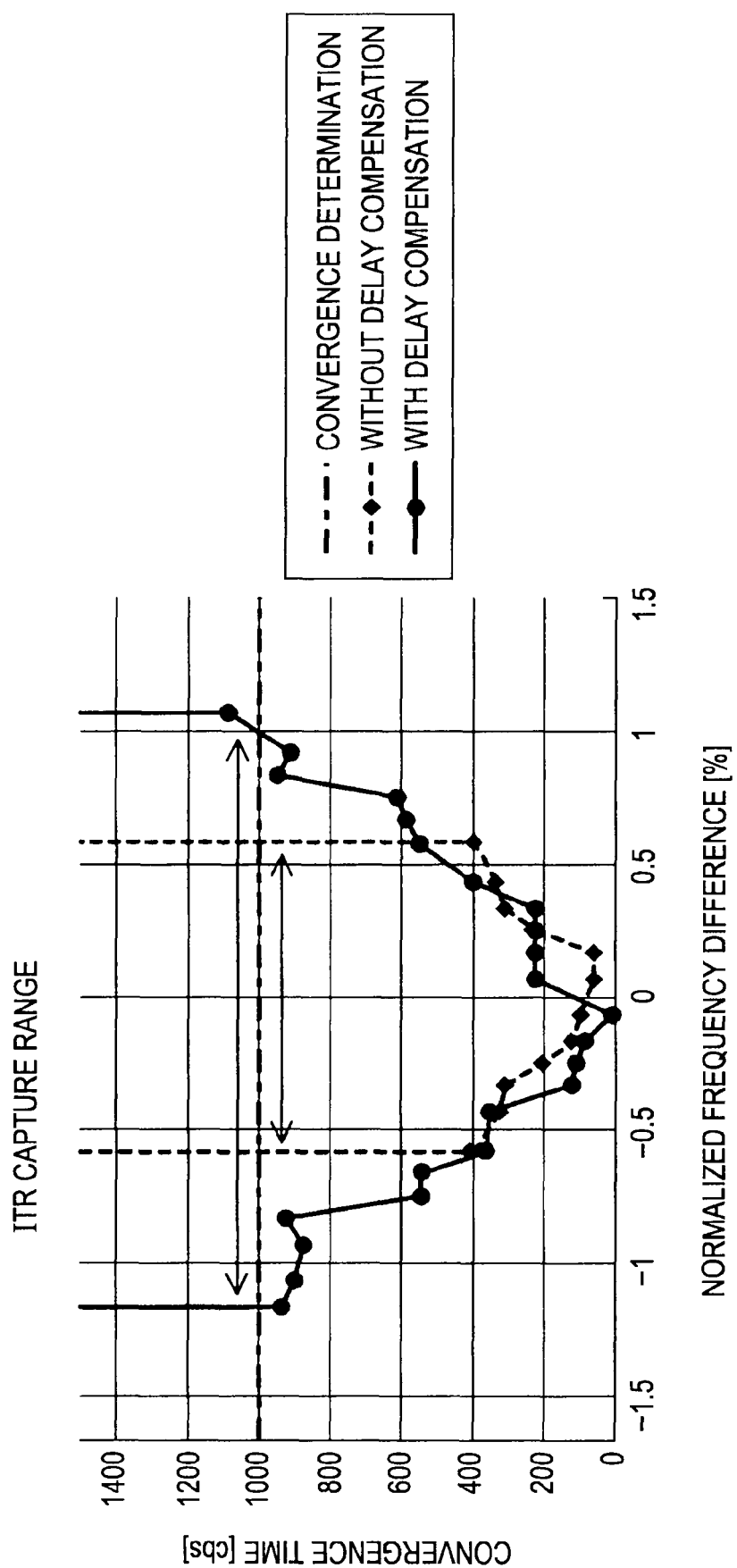
FIG. 15 is a graph for description of simulation results of capture ranges in the PLL model according to the embodiment of the present invention.

FIG. 15 shows simulation results of the capture ranges.

The capture range is defined as the frequency difference range over which the PLL can be converged within a predetermined time.

The variation characteristics of the convergence time with respect to the frequency difference are shown in FIG. 15, in which the horizontal axis represents frequency difference (normalized frequency difference) and the vertical axis represents convergence time (the number of channel bits (cbs)). Referring to FIG. 15, the simulation result when the delay compensation is performed (according to the embodiment of the present invention) is indicated by a combination of circular points and a solid line, and the simulation result when the delay compensation is not performed is indicated by a combination of diamond-shaped points and a broken line.

In the simulation results in FIG. 15, the frequency difference range which is denoted by an alternate long and short dash line (used for the convergence determination) and whose convergence time is not higher than 1,000 cbs is defined as the capture range. Referring to FIG. 15, the capture range without the delay compensation is about 1.1% whereas the capture range with the delay compensation according to the embodiment of the present invention is about 2.2%, which is about two times wider than the capture range without the delay compensation.

Figure 16:
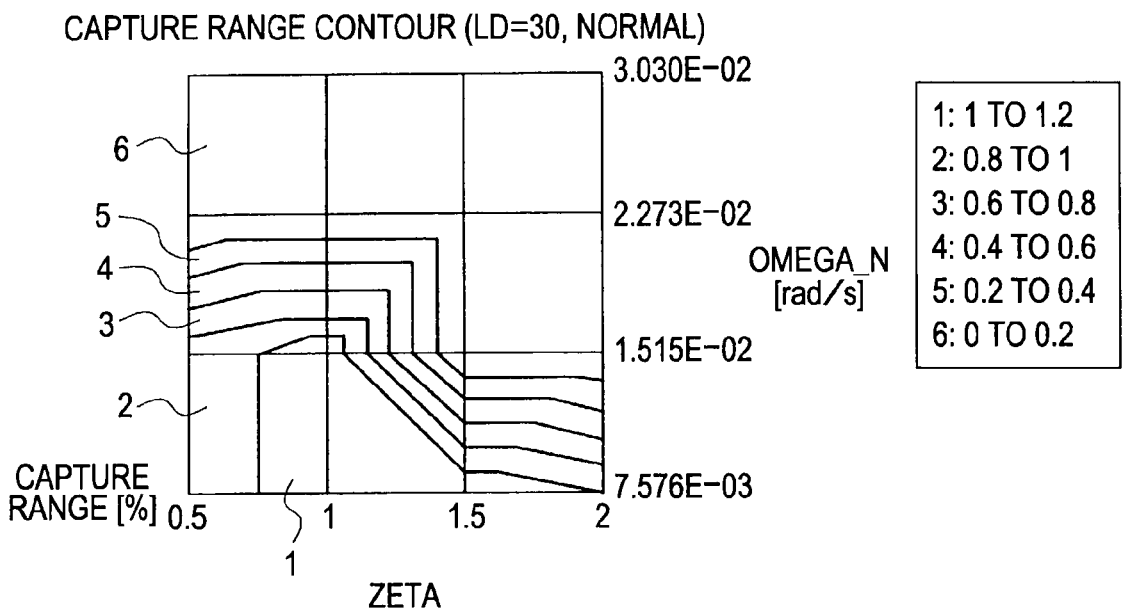
FIG. 16 shows an exemplary result in which the capture ranges when PLL constants are varied are represented by contour lines without the compensation of the loop delay.
Figure 17:
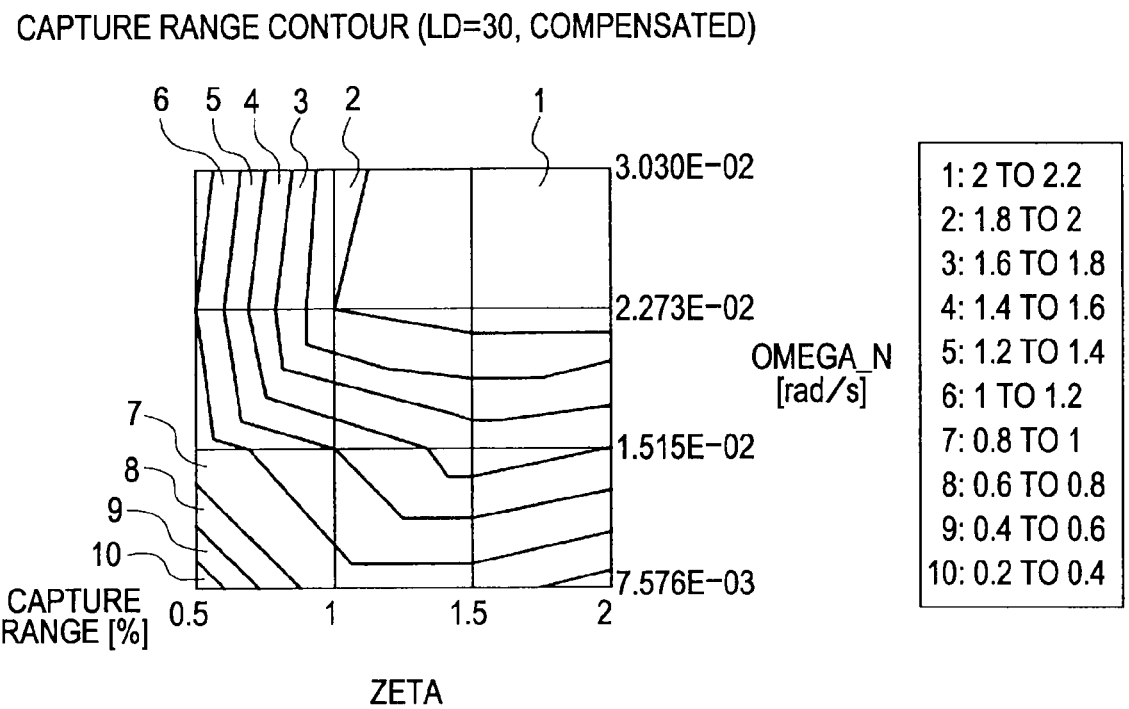
FIG. 17 shows an exemplary result in which the capture ranges when PLL constants are varied are represented by contour lines with the compensation of the loop delay according to the embodiment of the present invention.

FIGS. 16 and 17 show examples of the capture ranges when the PLL constants ζ and $ω_n$ are varied. The capture ranges in FIGS. 16 and 17 are represented by contour lines. FIG. 16 shows an exemplary result without the delay compensation. FIG. 17 shows an exemplary result with the delay compensation according to the embodiment of the present invention.

The amount D of the loop delay is set to "30" (D=30) in FIGS. 16 and 17. The capture range is increased as the number shown in FIGS. 16 and 17 becomes small.

In the capture range without the delay compensation in FIG. 16, no area having a capture range higher than or equal to 1 to 1.2 appears even if the PLL constants are varied. In contrast, in the capture range with the delay compensation in FIG. 17 according to the embodiment of the present invention, areas having capture ranges of 2 to 2.2 appear by selecting the appropriate PLL constants. Accordingly, the increase in the capture range with the delay compensation according to the embodiment of the present invention can be confirmed also in FIGS. 16 and 17.

MODIFICATIONS

Although the embodiments of the present invention have been described, the present invention is not limited to the examples described above.

For example, although the embodiments of the present invention are applied to the system for playing back data recorded on the optical disk recording medium, the embodiments of the present invention are preferably applicable to a system for playing back data recorded on a magnetic recording medium, such as an HDD.

In addition, the embodiments of the present invention are preferably applicable to a case where the timing synchronization of reception signals is achieved in a data communication system, in addition to the system for playing back data recorded on the recording medium.

The present invention is preferably applicable to a case where a closed loop formed in a feedback control loop that includes a loop filter and that detects the difference between a target value and a control value to control the difference so that the difference has a predetermined value is expressed by the delay of the entire closed loop serving as the feedback control loop, the loop filter, and simple integration of the final stage.

It should be understood by those skilled in the art that various modifications, combinations, sub-combinations and alterations may occur depending on design requirements and other factors insofar as they are within the scope of the appended claims or the equivalents thereof.

What is claimed is:

1. A signal processing circuit configured so as to compose a feedback control loop that includes a loop filter and that detects the difference between a target value and a control value to control the difference so that the difference has a predetermined value, a closed loop formed in the feedback control loop being expressed by the delay of the entire closed loop serving as the feedback control loop, the loop filter, and simple integration of a final stage, the signal processing circuit comprising:
    moving average calculating means for calculating a moving average of outputs from the loop filter;
    multiplying means for multiplying a value calculated in the loop filter by a certain gain; and
    integrating means provided upstream of the loop filter so that a calculation result by the moving average calculating means and a calculation result by the multiplication means are concurrently fed back to an input into the loop filter.

2. The signal processing circuit according to claim 1,
    wherein a control system for a secondary delay unit in which the loop filter includes a proportion filter and an integration filter is formed in the signal processing circuit, and
    wherein the multiplication means multiplies an integration term of the loop filter by the certain gain.

3. The signal processing circuit according to claim 2,
    wherein the moving average calculating means calculates the moving average of a number of the outputs from the loop filter, the number of the outputs being given by subtracting one from the amount of delay in the entire closed loop,
    wherein the multiplication means multiplies the integration term of the loop filter by the amount of delay in the entire closed loop corresponding to the certain gain, and
    wherein the integrating means performs an addition and a subtraction so that the calculation result by the moving average calculating means is negatively fed back to the input into the loop filter and the calculation result by the multiplication means is positively fed back to the input into the loop filter.

4. The signal processing circuit according to claim 3,
    wherein the signal processing circuit is a phase locked loop circuit that controls the phase and the frequency of an input signal.

5. A signal processing method wherein, when a closed loop formed in a feedback control loop that includes a loop filter and that detects the difference between a target value and a control value to control the difference so that the difference has a predetermined value is expressed by the delay of the entire closed loop serving as the feedback control loop, the loop filter, and simple integration of a final stage, a moving average of outputs from the loop filter and a value resulting from multiplication of a value calculated in the loop filter by a certain gain are concurrently fed back to an input into the loop filter.

6. A playback apparatus at least playing back data recorded on a recording medium, the playback apparatus comprising:
    readout means for reading out a signal recorded on the recording medium; and
    a phase locked loop circuit configured so as to serve as a control system for a secondary delay unit that includes a loop filter including a proportion filter and an integration filter, the phase locked loop circuit controlling the phase and frequency of the signal read out by the readout means,
    wherein the phase locked loop circuit is configured so that a closed loop formed in a feedback control loop is expressed by the delay of the entire closed loop serving as the feedback control loop, the loop filter, and simple integration of a final stage, and
    wherein the phase locked loop circuit includes
        moving average calculating means for calculating a moving average of outputs from the loop filter;

multiplying means for multiplying an integration term of the loop filter by a certain gain; and integrating means provided upstream of the loop filter so that a calculation result by the moving average calculating means and a calculation result by the multiplication means are concurrently fed back to an input into the loop filter.

7. The playback apparatus according to claim 6, wherein the moving average calculating means calculates the moving average of a number of the outputs from the loop filter, the number of the outputs being given by subtracting one from the amount of delay in the entire closed loop, wherein the multiplication means multiplies the integration term of the loop filter by the amount of delay in the entire closed loop corresponding to the certain gain, and wherein the integrating means performs an addition and a subtraction so that the calculation result by the moving average calculating means is negatively fed back to the input into the loop filter and the calculation result by the multiplication means is positively fed back to the input into the loop filter.

8. A signal processing circuit configured so as to compose a feedback control loop that includes a loop filter and that detects the difference between a target value and a control value to control the difference so that the difference has a predetermined value, a closed loop formed in the feedback control loop being expressed by the delay of the entire closed loop serving as the feedback control loop, the loop filter, and simple integration of a final stage, the signal processing circuit comprising:

a moving average calculating unit configured to calculate a moving average of outputs from the loop filter;

a multiplying unit configured to multiply a value calculated in the loop filter by a certain gain; and an integrating unit provided upstream of the loop filter so that a calculation result by the moving average calculating unit and a calculation result by the multiplication unit are concurrently fed back to an input into the loop filter.

9. A playback apparatus at least playing back data recorded on a recording medium, the playback apparatus comprising:

a readout unit configured to read out a signal recorded on the recording medium; and a phase locked loop circuit configured so as to serve as a control system for a secondary delay unit that includes a loop filter including a proportion filter and an integration filter, the phase locked loop circuit controlling the phase and frequency of the signal read out by the readout unit, wherein the phase locked loop circuit is configured so that a closed loop formed in a feedback control loop is expressed by the delay of the entire closed loop serving as the feedback control loop, the loop filter, and simple integration of a final stage, and wherein the phase locked loop circuit includes a moving average calculating unit configured to calculate a moving average of outputs from the loop filter;

a multiplying unit configured to multiply an integration term of the loop filter by a certain gain; and an integrating unit provided upstream of the loop filter so that a calculation result by the moving average calculating unit and a calculation result by the multiplication unit are concurrently fed back to an input into the loop filter.

* * * * *